(12) United States Patent
Hester et al.

(10) Patent No.: US 11,843,251 B2
(45) Date of Patent: *Dec. 12, 2023

(54) CONTROLLER CIRCUIT FOR PHOTOVOLTAIC SUB-MODULE

(71) Applicant: TEXAS INSTRUMENTS INCORPORATED, Dallas, TX (US)

(72) Inventors: Richard Hester, McKinney, TX (US); Timothy Patrick Pauletti, Dallas, TX (US); Suheng Chen, Plano, TX (US); Amneh Mohammed Akour, Plano, TX (US); Nat Maruthachalam Natarajan, Plano, TX (US); Jayanth Rangaraju, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/512,459

(22) Filed: Oct. 27, 2021

(65) Prior Publication Data

US 2022/0069585 A1  Mar. 3, 2022

Related U.S. Application Data

(62) Division of application No. 16/736,312, filed on Jan. 7, 2020, now Pat. No. 11,190,022.

(60) Provisional application No. 62/790,078, filed on Jan. 9, 2019.

(51) Int. Cl.
*H02J 3/38* (2006.01)
*H03L 7/08* (2006.01)

(52) U.S. Cl.
CPC .......... *H02J 3/381* (2013.01); *H02J 2300/26* (2020.01); *H03L 7/08* (2013.01)

(58) Field of Classification Search
CPC ......... H02J 3/381; H02J 2300/26; H03L 7/08; H02S 50/00; H02S 40/30; G05F 1/67; Y02E 10/56
USPC .......................................................... 307/78
See application file for complete search history.

(56) References Cited

U.S. PATENT DOCUMENTS 11,190,022 B2 * 11/2021 Hester .................... H02S 50/00

* cited by examiner

*Primary Examiner* — Richard Tan
(74) *Attorney, Agent, or Firm* — John R. Pessetto; Frank D. Cimino

(57) ABSTRACT

A controller circuit for a PV sub-module includes a power harvest controller circuit, a voltage limit controller circuit, a power mode control circuit, a multiplexer circuit, and a switching converter circuit. The power harvest controller circuit, including a first PV voltage input, a ceiling reference input, a floor reference input, and a first gate control output. The voltage limit controller circuit, including a first output voltage feedback input, a pulse width reference input, and a second gate control output. The power mode control circuit, including a second output voltage feedback input, a mode reference input, and a mode selection output. The multiplexer circuit, including a first gate control input, a second gate control input, a mode selection input, and a third gate control output. The switching converter circuit, including a second PV voltage input, a third gate control input, and a DC voltage output.

18 Claims, 16 Drawing Sheets

CONTROLLER CIRCUIT FOR PHOTOVOLTAIC SUB-MODULE

This application is a divisional of U.S. application Ser. No. 16/736,312 filed Jan. 7, 2020, which claims priority to, and the benefit of, U.S. Provisional Patent Application Ser. No. 62/790,078, entitled "Integrated Power Optimizer and PLC Communication RSD Device for Photovoltaic Systems," filed Jan. 9, 2019, the entirety of each of which is hereby incorporated by reference.

BACKGROUND

Photovoltaic (PV) power optimizers run at the string level of PV systems. These optimizers find a maximum power point (MPP) of the entire string. However, the string is physically spread over a large surface area. Any shading of sunlight that occurs in any portion of the string affects the operating power point of the entire PV array even if some PV modules are in full sun.

SUMMARY

According to one aspect, a controller circuit for a PV sub-module includes a power harvest controller circuit, a voltage limit controller circuit, a power mode control circuit, a multiplexer circuit, and a switching converter circuit. The power harvest controller circuit includes a first PV voltage input, a ceiling reference input, a floor reference input, and a first gate control output. The voltage limit controller circuit includes a first output voltage feedback input, a pulse width reference input, and a second gate control output. The power mode control circuit includes a second output voltage feedback input, a mode reference input, and a mode selection output. The multiplexer circuit includes a first gate control input coupled to the first gate control output, a second gate control input coupled to the second gate control output, a mode selection input coupled to the mode selection output, and a third gate control output. The switching converter circuit includes a second PV voltage input, a third gate control input coupled to the third gate control output, a DC voltage output, and a switch coupled between the second PV voltage input and the DC voltage output. The switch includes a control terminal coupled to the third gate control input.

In another aspect, a method for controlling a PV sub-module includes generating a first gate control signal at a first gate control output of a power harvest controller circuit based on a first DC string voltage signal from a string of PV cells associated with the PV sub-module at a first PV voltage input, a ceiling reference signal VRC representative of a ceiling threshold for the first DC string voltage signal at a ceiling reference input, and a floor reference signal VRF that represents a floor threshold for the first DC string voltage signal DC PV+ at a floor reference input. The method also includes generating a second gate control signal at a second gate control output of a voltage limit controller circuit based on a first feedback signal that represents a DC output voltage signal associated with the PV sub-module at a first output voltage feedback input and a pulse width modulation (PWM) reference signal that represents a first threshold for the DC output voltage signal at a pulse width reference input. The method also includes generating a mode selection signal based on a second feedback signal that represents the DC output voltage signal at a second output voltage feedback input and a mode reference signal VMR that represents a second threshold for the DC output voltage signal at a mode reference input. The method also includes routing the first gate control signal or the second gate control signal to a third gate control signal in response to the mode selection signal at a mode selection input. The method also includes converting the first DC string voltage signal at a second PV voltage input of a switching converter circuit to the DC output voltage signal at a DC voltage output in response to the third gate control signal at a third gate control input.

In another aspect, a controller circuit for a PV sub-module includes a maximum power point tracking (MPPT) reference and window generator circuit, a power harvest controller circuit, and a switching converter circuit. The MPPT reference and window generator circuit, including a DC voltage input, a first gate control input, a ceiling reference output, and a floor reference output. The power harvest controller circuit includes a first PV voltage input, a ceiling reference input coupled to the ceiling reference output, a floor reference input coupled to the floor reference output, and a gate control output coupled to the first gate control input. The switching converter circuit includes a second PV voltage input, a second gate control input coupled to the gate control output, a DC voltage output, and a switch coupled between the second PV voltage input and the DC voltage output. The switch including a control terminal coupled to the second gate control input.

In a further aspect, a controller circuit for a PV sub-module includes a voltage limit controller circuit and a switching converter circuit. The voltage limit controller circuit includes an output voltage feedback input, a pulse width reference input, and a gate control output. The switching converter circuit includes a PV voltage input, a gate control input coupled to the gate control output, a DC voltage output, and a switch coupled between the PV voltage input and the DC voltage output. The switch including a control terminal coupled to the gate control input.

DETAILED DESCRIPTION

Figure 1:
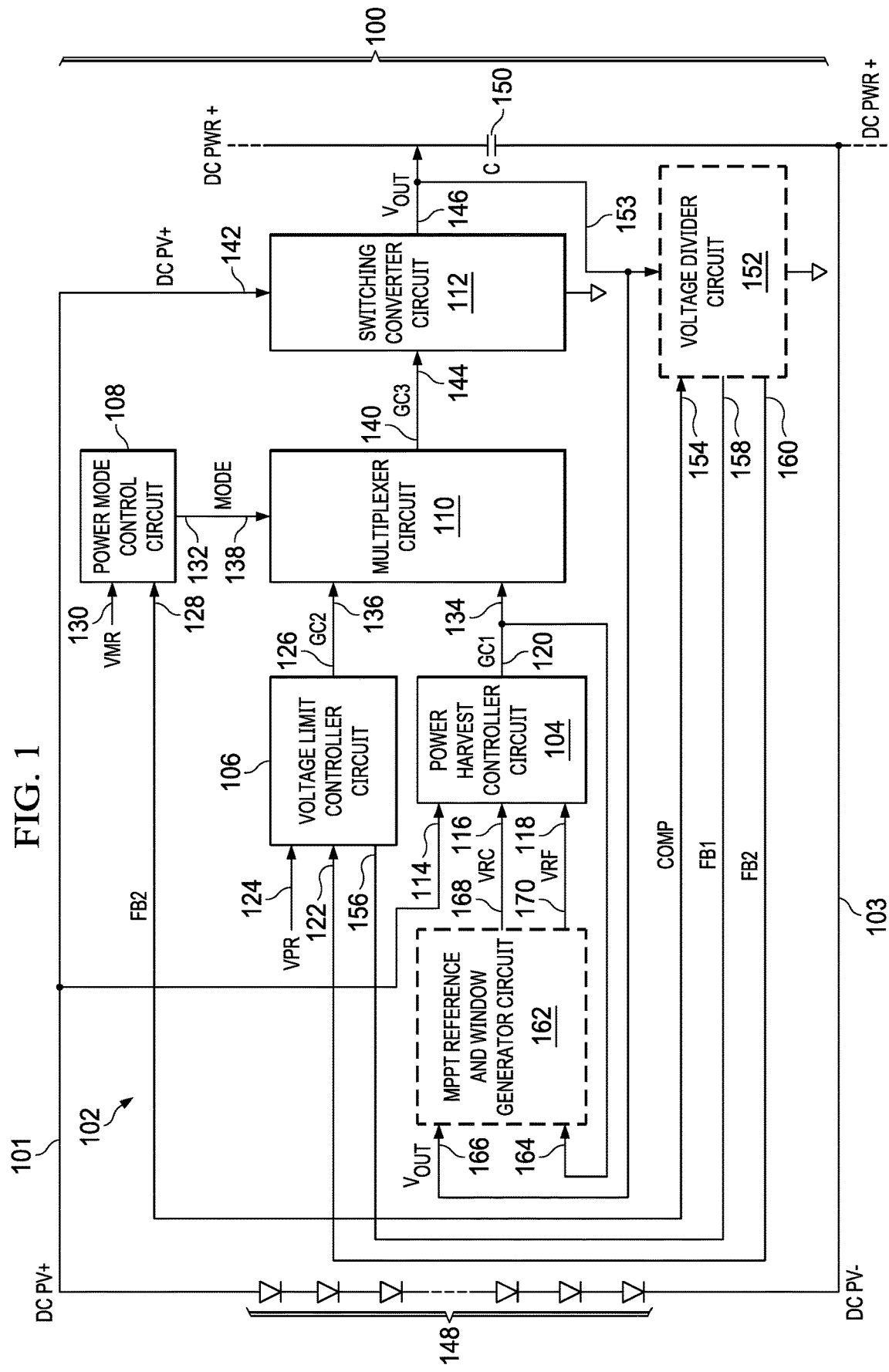
FIG. 1 is a schematic diagram of an example of a controller circuit for a PV sub-module.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner like the term "comprising", and thus should be interpreted to mean "including, but not limited to . . . " Also, the terms "couple" or "couples" or "coupled" includes indirect or direct electrical or mechanical connection or combinations thereof. For example, if a first device couples to or is coupled to a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows an example of a controller circuit 102 for a photo voltaic (PV) sub-module 100 coupled to a first string terminal 101 of a string of PV cells. A photovoltaic power system in one example includes multiple sub-modules 100 individually associated with respective strings of PV cells, where the sub-modules have outputs coupled in series with one another. The string of PV cells in FIG. 1 has a second string terminal 103. The first and second string terminals 101 and 103 have respective first and second string voltage signals DC PV+ and DC PV−. The controller circuit 102 includes a power harvest controller circuit 104, a voltage limit controller circuit 106, a power mode control circuit 108, a multiplexer circuit 110, and a switching converter circuit 112. The power harvest controller circuit 104 includes a first PV voltage input 114, a ceiling reference input 116, a floor reference input 118, and a first gate control output 120. The voltage limit controller circuit 106 includes a first output voltage feedback input 122, a pulse width reference input 124, and a second gate control output 126. The power mode control circuit 108 includes a second output voltage feedback input 128, a mode reference input 130, and a mode selection output 132. The multiplexer circuit 110 includes a first gate control input 134 coupled to the first gate control output 120, a second gate control input 136 coupled to the second gate control output 126, a mode selection input 138 coupled to the mode selection output 132, and a third gate control output 140. The switching converter circuit 112 includes a second PV voltage input 142, a third gate control input 144 coupled to the third gate control output 140, a DC voltage output 146, and a switch coupled between the second PV voltage input 142 and the DC voltage output 146, where the switch includes a control terminal coupled to the third gate control input 144.

The power harvest controller circuit 104 receives the first DC string voltage signal DC PV+ from the first terminal 101 of the string of PV cells 148 associated with the PV sub-module 100. The power harvest controller circuit 104 generates a first gate control signal GC1 based on the first DC string voltage signal DC PV+, a ceiling reference signal VRC that represents a ceiling threshold for the first DC string voltage signal DC PV+, and a floor reference signal VRF that represents a floor threshold for the first DC string voltage signal DC PV+. The voltage limit controller circuit 106 generates a second gate control signal GC2 based on a first feedback signal FB1 that represents the DC output voltage signal $V_{OUT}$ associated with the PV sub-module 100 and the PWM reference signal VPR that represents a first threshold for the DC output voltage signal $V_{OUT}$.

The power mode control circuit 108 generates a mode selection signal MODE based on a second feedback signal FB2 that represents the DC output voltage signal $V_{OUT}$ and a mode reference signal VMR that represents a second threshold for the DC output voltage signal $V_{OUT}$. The multiplexer circuit 110 receives the first gate control signal GC1 from the power harvest controller circuit 104. The multiplexer circuit 110 receives the second gate control signal GC2 from the voltage limit controller circuit 106. The multiplexer circuit 110 receives the mode selection signal MODE from the power mode control circuit 108. The multiplexer circuit 110 routes the first gate control signal GC1 or the second gate control signal GC2 to a third gate control signal GC3 in response to the mode selection signal MODE. The switching converter circuit 112 receives the first DC string voltage signal DC PV+ from the first string terminal 101 of the string of PV cells 148. The switching converter circuit 112 receives the third gate control signal GC3 from the multiplexer circuit 110. The switching converter circuit 112 converts the first DC string voltage signal DC PV+ to the DC output voltage signal $V_{OUT}$ in response to the third gate control signal GC3. The controller circuit 102 provides the DC output voltage signal $V_{OUT}$ to power lines associated with the PV sub-module 100. In this example, a capacitor 150 is coupled between the DC voltage output 146 and the second string terminal 103 and the DC output voltage signal $V_{OUT}$ is applied across the capacitor 150. The first power line is coupled to the DC voltage output 146 of the switching converter circuit 112 and has a voltage signal DC PWR+ equal to the DC output voltage signal $V_{OUT}$. The second power line is coupled to the second string output terminal 103 and has a voltage signal DC PWR− equal to the second string voltage signal DC PV−.

In one example, the PV sub-module 100 includes the controller circuit 102. In another example, the power harvest controller circuit 104, the voltage limit controller circuit 106, the power mode control circuit 108, and the multiplexer circuit 110 are included in an IC. In one implementation, the power harvest controller circuit 104 adjusts a first gate control signal GC1 at the first gate control output 120 in response to changes in the first DC string voltage signal DC PV+ at the first PV voltage input 114, in order to harvest power from the PV sub-module 100.

In another example, the first threshold is indicative of a condition in which the DC output voltage signal $V_{OUT}$ is less than an open circuit voltage $V_{OC}$ for the PV sub-module 100 and greater than the DC output voltage signal $V_{OUT}$ associated with the first gate control signal GC1 from the power harvest controller circuit 104. In another example, the second threshold is less than the first threshold. In another example, the second threshold is indicative of a condition in which the DC output voltage signal $V_{OUT}$ is adjusted in response to changes in the first DC string voltage signal DC PV+ and less than the DC output voltage signal $V_{OUT}$ associated with the second gate control signal GC2 from the voltage limit controller circuit 106.

In another example, when the voltage limit controller circuit 106 controls the switching converter circuit 112 a DC output voltage signal $V_{OUT}$ at the DC voltage output 146 is less than an open circuit voltage for the PV sub-module 100 and greater than the DC output voltage signal $V_{OUT}$ associated with a first gate control signal GC1 at the first gate control output 120. In another example, when the power harvest controller circuit 104 controls the switching converter circuit 112, a DC output voltage signal $V_{OUT}$ at the DC voltage output 146 is adjusted in response to changes in the first DC string voltage signal DC PV+ at the first PV voltage input 114 and less than the DC output voltage signal $V_{OUT}$ associated with a second gate control signal GC2 at the second gate control output 126.

In another example, the power mode control circuit 108 sets the mode selection signal MODE at the mode selection output 132 to a first condition (e.g., HARVEST) associated with routing a first gate control signal GC1 at the first gate control input 134 to the third gate control signal GC3 at the third gate control output 140 in response to a second feedback signal FB2 at the second output voltage feedback input 128 being less than the mode reference signal VMR at the mode reference input 130. Otherwise, the power mode control circuit 108 sets the mode selection signal MODE to a second condition (e.g., LIMIT) associated with routing the second gate control signal GC2 at the second gate control input 136 to the third gate control signal GC3. In another example, the switching converter circuit 112 provides the DC output voltage signal $V_{OUT}$ to a DC PWR+ power line of a PV system associated with the PV sub-module 100.

In another example, the first gate control signal includes a high side first gate control signal (e.g., GC1) and another (e.g., low side) first gate control signal GCL1. In this example, the second gate control signal includes one second gate control signal (e.g., a high side gate control signal GC2) and another (e.g., low side second gate control signal GCL2), and the third gate control signal includes one (e.g., high side) third gate control signal GC3 and another (e.g., low side) third gate control signal GCL3. In this example, the power harvest controller circuit 104 generates the first gate control signals GC1 and GCL1. The voltage limit controller circuit 106 generates the second gate control signals GC2 and GCL2. The multiplexer circuit 110 receives the first gate control signals GC1 and GCL1 from the power harvest controller circuit 104. The multiplexer circuit 110 receives the second gate control signals GC2 and GCL2 from the voltage limit controller circuit 106. The multiplexer circuit 110 routes the first gate control signal GC1 or the one second gate control signal GC2 to the one third gate control signal GC3 in response to the mode selection signal MODE. The multiplexer circuit 110 routes the low side first gate control signal GCL1 or the low side second gate control signal GCL2 to the other third gate control signal GCL3 in response to the mode selection signal MODE. In this example, the switching converter circuit 112 receives the one third gate control signals GC3 and GCL3 from the multiplexer circuit 110. The switching converter circuit 112 converts the first DC string voltage signal DC PV+ to the DC output voltage signal $V_{OUT}$ in response to the one third gate control signals GC3 and GCL3.

In another example, the controller circuit 102 also includes a voltage divider circuit 152. The voltage divider circuit 152 includes a first DC voltage input 153 coupled to the DC voltage output 146, a compensation input 154 coupled to a compensation output 156, a first output voltage feedback output 158 coupled to the first output voltage feedback input 122, and a second output voltage feedback output 160 coupled to the second output voltage feedback input 128. The voltage divider circuit 152 receives the DC output voltage signal $V_{OUT}$ from the switching converter circuit 112. The voltage divider circuit 152 generates the respective first and second feedback signals FB1 and FB2s based on the DC output voltage signal $V_{OUT}$. The voltage divider circuit 152 provides the first feedback signal FB1 to the voltage limit controller circuit 106. The voltage divider circuit 152 provides the second feedback signal FB2 to the power mode control circuit 108. In a further example, the voltage limit controller circuit 106 generates a compensation signal COMP based on a difference between the PWM reference signal VPR and the first feedback signal FB1. In this example, the voltage divider circuit 152 receives the compensation signal COMP from the voltage limit controller circuit 106 and generates the first feedback signal FB1 based on the compensation signal COMP.

In another example, the controller circuit 102 also includes an MPPT reference and window generator circuit 162. The MPPT reference and window generator circuit 162 includes a second DC voltage input 166 coupled to the DC voltage output 146, a first gate control input 164 coupled to the first gate control output 120, a ceiling reference output 168 coupled to the ceiling reference input 116, and a floor reference output 170 coupled to the floor reference input 118. The MPPT reference and window generator circuit 162 receives the DC output voltage signal $V_{OUT}$ from the switching converter circuit 112. The MPPT reference and window generator circuit 162 receives the first gate control signal GC1 from the power harvest controller circuit 104. The MPPT reference and window generator circuit 162 generates the ceiling reference signal VRC and the floor reference signal VRF based on the DC output voltage signal $V_{OUT}$ and the first gate control signal GC1.

Figure 2:
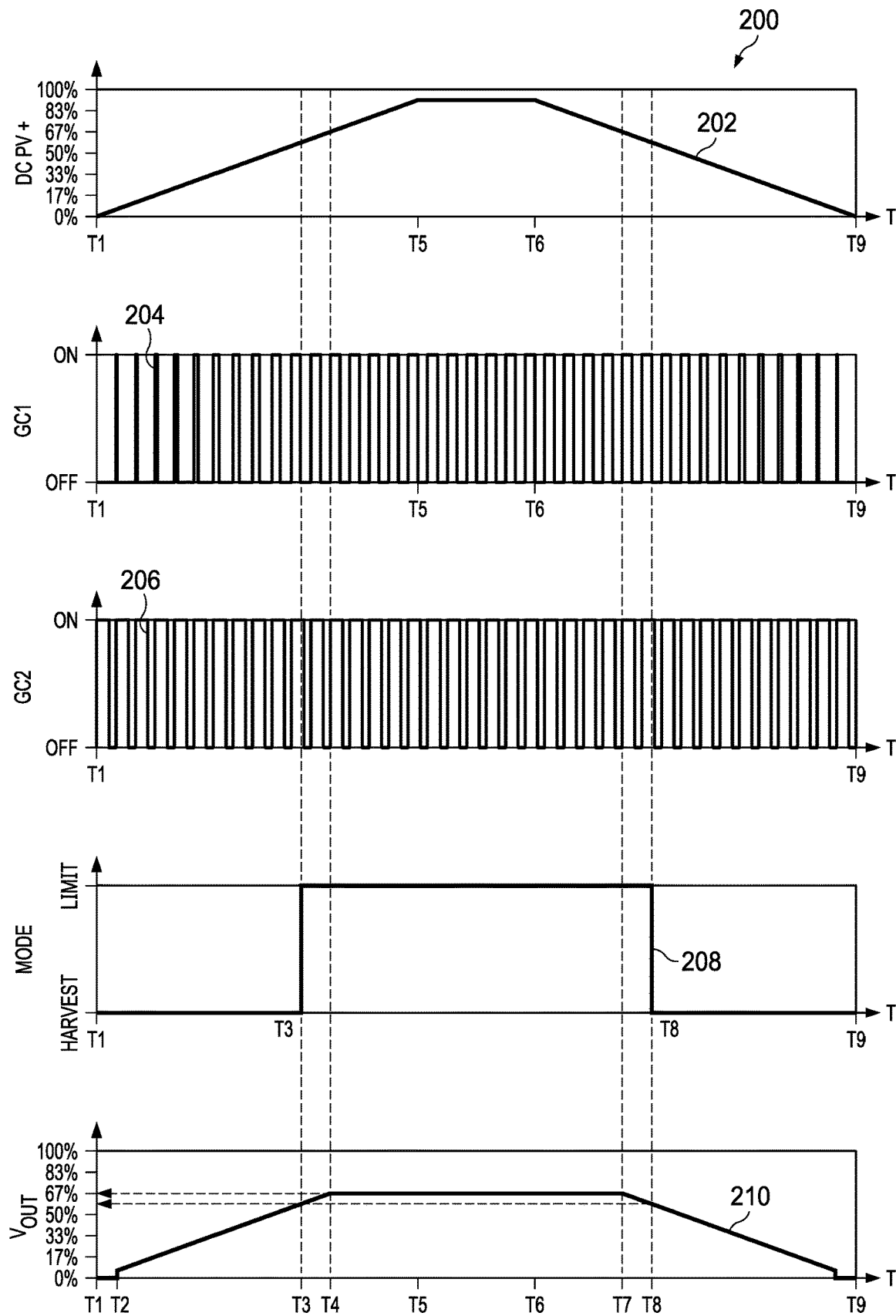
FIG. 2 is a timing diagram that shows an example of the timing of select signals shown in FIG. 1.

FIG. 2 shows a timing diagram 200 of an example of the timing of select signals in FIG. 1 in relation to operation of the controller circuit 102 and PV sub-module 100 over a sunrise-to-sunset scenario. The timing diagram 200 reflects a simplified scenario for a PV sub-module 100 that is stationary. The controller circuit 102 and PV sub-module 100 generally experience this scenario daily with minor day-to-day and seasonal changes based on actual environmental conditions. In the sunrise-to-sunset scenario, the PV sub-module 100 begins receiving sunlight at sunrise (T1). The amount of sunlight received increases until the PV sub-module 100 is fully exposed to the sun (T5-T6). Then, the amount of sunlight received by the PV sub-module 100 decreases until it no longer receives sunlight at sunset (T9). In other examples, the amount of sunlight received by the PV sub-module 100 during daylight hours may vary based on dust, dirt, debris, snow, ice, rain, clouds, shade, or other conditions that cause a portion of sunlight that would otherwise reach the PV sub-module 100 to be filtered or blocked. In other examples, the PV sub-module 100 tracks the sun or is otherwise adjusted to follow the sun in relation to a daily cycle. In these examples, the select signals would be different but react to environmental conditions in a similar manner to that described herein for the stationary PV sub-module.

A curve 202 shows an example of the first DC string voltage signal DC PV+ generated by the string of PV cells 148. The first DC string voltage signal DC PV+ is provided to the power harvest controller and switching converter circuits 104, 112 of the controller circuit 102. At sunrise (T1), the first DC string voltage signal DC PV+ starts increasing from zero (0) percent to 91.5 percent at midday (T5-T6). The first DC string voltage signal DC PV+ starts decreasing from 91.5 percent during the afternoon and reaches zero (0) percent at sunset (T9). The first DC string voltage signal DC PV+ from the string of PV cells 148 is shown as an analog signal in linear portions with sharp transitions to simplify the discussion herein. In one implementation, the first DC string voltage signal DC PV+ varies over time due to numerous factors (e.g., rain, clouds, etc.) and may exhibit curves and smooth transitions rather than the linear portions with sharp transitions. In this example, the first DC string voltage signal DC PV+ from the string of PV cells 148 is 91.5 percent when the cells are fully exposed to the sun (T5-T6). In other examples, the output voltage when the cells of the string of PV cells 148 are fully exposed to the sun (T5-T6) may be higher or lower.

A curve 204 shows the first gate control signal GC1 generated by the power harvest controller circuit 104. The first gate control signal GC1 is provided to the multiplexer circuit 110. The first gate control signal GC1 is a digital signal that varies between "OFF" and "ON" conditions. The power harvest controller circuit 104 varies the first gate control signal GC1 between the "OFF" and "ON" conditions to form a pulse train. The power harvest controller circuit 104 controls a duty cycle for the "ON" condition of the pulse train in relation to the first DC string voltage signal DC PV+ generated by the string of PV cells 148. At sunrise (T1), the "ON" time for the HG HARVEST signal starts increasing from zero (0) percent to 58.5 percent at midday (T5-T6). The "ON" time for the first gate control signal GC1 starts decreasing from 58.5 percent during the afternoon and reaches zero (0) percent at sunset (T9). The curve 204 shows the first gate control signal GC1 as a pulse train with steadily varying duty cycles in linear portions with sharp transitions to simplify the discussion herein. In one implementation, the first gate control signal GC1 includes a residual noise level, the varying duty cycle may not be as steady due to various factors (e.g., rain, clouds, etc.), and the pulse train may exhibit curves and smooth transitions rather than the linear portions with sharp transitions. In this example, the maximum duty cycle of the first gate control signal GC1 is 58.5 percent when the cells in the string of PV cells 148 are fully exposed to the sun (T5-T6). In other examples, the maximum duty cycle when the cells of the string of PV cells 148 are fully exposed to the sun (T5-T6) may be higher or lower.

A curve 206 shows the second gate control signal GC2 generated by the voltage limit controller circuit 106. The second gate control signal GC2 is provided to the multiplexer circuit 110. The second gate control signal GC2 is a digital signal that varies between "OFF" and "ON" conditions. The voltage limit controller circuit 106 varies the second gate control signal GC2 between the "OFF" and "ON" conditions to form a pulse train with a pre-determined duty cycle (e.g., 67 percent). For example, at sunrise (T1), the "ON" time for the second gate control signal GC2 starts at a 67 percent duty cycle and remains at 67 percent until sunset (T9). The plot shows the second gate control signal GC2 as a pulse train with a steady duty cycle in linear portions with sharp transitions to simplify the discussion herein. In one implementation, the second gate control signal GC2 includes a residual noise level, the duty cycle of the pulse train may vary due to residual noise and tolerance factors, and the pulse train may exhibit curves and smooth transitions rather than the linear portions with sharp transitions. In this example, the pre-determined duty cycle of the second gate control signal GC2 is 67 percent. In other examples, the pre-determined duty cycle may be higher or lower.

A curve 208 shows an example of the mode selection signal MODE generated by the power mode control circuit 108. The mode selection signal MODE is provided to the multiplexer circuit 104. The mode selection signal MODE is a digital signal that varies between "HARVEST" and "LIMIT" conditions. The power mode control circuit 108 switches the mode selection signal MODE between the "HARVEST" and "LIMIT" conditions based on the DC output voltage signal $V_{OUT}$ provided at the DC voltage output 146 of the switching converter circuit 112. At sunrise (T1), the mode selection signal MODE starts in the "HARVEST" condition. As midday approaches, the power mode control circuit 108 switches the mode selection signal MODE from the "HARVEST" condition to the "LIMIT" condition based on the DC output voltage signal $V_{OUT}$ exceeding a pre-determined threshold (e.g., 58.5 percent) (T3). After midday, the power mode control circuit 108 switches the mode selection signal MODE from the "LIMIT" condition to the "HARVEST" condition based on the DC output voltage signal $V_{OUT}$ becoming less than the pre-determined threshold (e.g., 58.5 percent) (T8). The mode selection signal MODE remains in the "HARVEST" condition until the DC output voltage signal $V_{OUT}$ exceeds the pre-determined threshold (e.g., 58.5 percent). The plot shows the mode selection signal MODE as a digital signal in linear portions with sharp transitions to simplify the discussion herein. In one implementation, the mode selection signal MODE includes a residual noise level and the digital signal may exhibit curves and smooth transitions rather than the linear portions with sharp transitions. In this example, the pre-determined threshold at which the power mode control circuit 108 switches between the "HARVEST" and "LIMIT" conditions is based on 58.5 percent for the DC output voltage signal $V_{OUT}$ provided at the DC voltage output 146 of the switching converter circuit 112. In other examples, the pre-determined threshold represents a higher or lower DC output voltage signal $V_{OUT}$. Furthermore, the power mode control circuit 108 may implement a hysteresis associated with the pre-determined threshold (e.g., 58.5 percent) that establishes a rising threshold (e.g., 59 percent) and a falling threshold (e.g., 58 percent) to avoid chatter in switching between the "HARVEST" and "LIMIT" conditions.

A curve 210 shows an example of the DC output voltage signal $V_{OUT}$ provided at the DC voltage output 146 of the switching converter circuit 112. The DC output voltage signal $V_{OUT}$ is provided to the DC PWR+ power line. Representations of the DC output voltage signal $V_{OUT}$ are also provided to the voltage limit controller, power mode control, and voltage divider circuits 106, 108, 152 for feedback associated with various control features of the controller circuit 102. At sunrise (T1), the mode selection signal MODE is in the "HARVEST" condition which causes the first gate control signal GC1 to be routed through the multiplexer circuit 110 to the switching converter circuit 112. As mentioned above, at sunrise (T1), the "ON" time for the first gate control signal GC1 starts increasing from zero (0) percent to 58.5 percent at midday (T5-T6). A delay in the first "ON" time for the first gate control signal GC1 causes the DC output voltage signal $V_{OUT}$ to remain at zero (0) percent for a short period after sunrise (T2). Then, the increasing duty cycle for the "ON" time of the first gate control signal GC1 causes the DC output voltage signal $V_{OUT}$ to start increasing to 58.5 percent (T3). After the DC output voltage signal $V_{OUT}$ exceeds the pre-determined threshold (e.g., 58.5 percent) (T3), the power mode control circuit 108 switches the mode selection signal MODE from the "HARVEST" condition to the "LIMIT" condition. This causes the second gate control signal GC2 to be routed through the multiplexer circuit 110 to the switching converter circuit 112. As mentioned above, the "ON" time for the HG LIMIT signal is based on a pre-determined duty cycle (e.g., 67 percent). The HG LIMIT signal causes the regulated causes the DC output voltage signal $V_{OUT}$ to continue increasing from 58.5 percent to 67 percent (T4). The DC output voltage signal $V_{OUT}$ remains at 67 percent until a point in the afternoon at which the exposure of the PV sub-module 100 to the sun is reduced (T7). The reduced exposure to the sun causes the DC output voltage signal $V_{OUT}$ to begin decreasing. After the DC output voltage signal $V_{OUT}$ becomes less than the pre-determined threshold (e.g., 58.5 percent) (T8), the power mode control circuit 108 switches the mode selection signal MODE from the "LIMIT" condition to the "HARVEST" condition. This causes the first gate control signal GC1 to be routed through the multiplexer circuit 110 to the switching converter circuit 112. As mentioned above, the "ON" time for the first gate control signal GC1 starts decreasing from 58.5 percent during the afternoon and reaches zero (0) percent at sunset (T9). This causes the DC output voltage signal $V_{OUT}$ to decrease from 58.5 percent to zero (0) percent at sunset (T9). The DC output voltage signal $V_{OUT}$ from the switching converter circuit 112 is shown as an analog signal in linear portions with sharp transitions to simplify the discussion herein. In one implementation, the DC output voltage signal $V_{OUT}$ varies over time due to numerous factors (e.g., rain, clouds, etc.) and may exhibit curves and smooth transitions rather than the linear portions with sharp transitions. In this example, the DC output voltage signal $V_{OUT}$ ranges from zero (0) to 58.5 percent when the first gate control signal GC1 is routed to the switching converter circuit 112 and ranges from 58.5 to 67 percent when the second gate control signal GC2 is routed to the switching converter circuit 112. In other examples, the voltage ranges may vary. For example, the 58.5 percent voltage may be higher or lower and the 67 percent voltage may be higher or lower. The voltage range associated with the second gate control signal GC2 is higher than the voltage range associated with the first gate control signal GC1.

Figure 3:
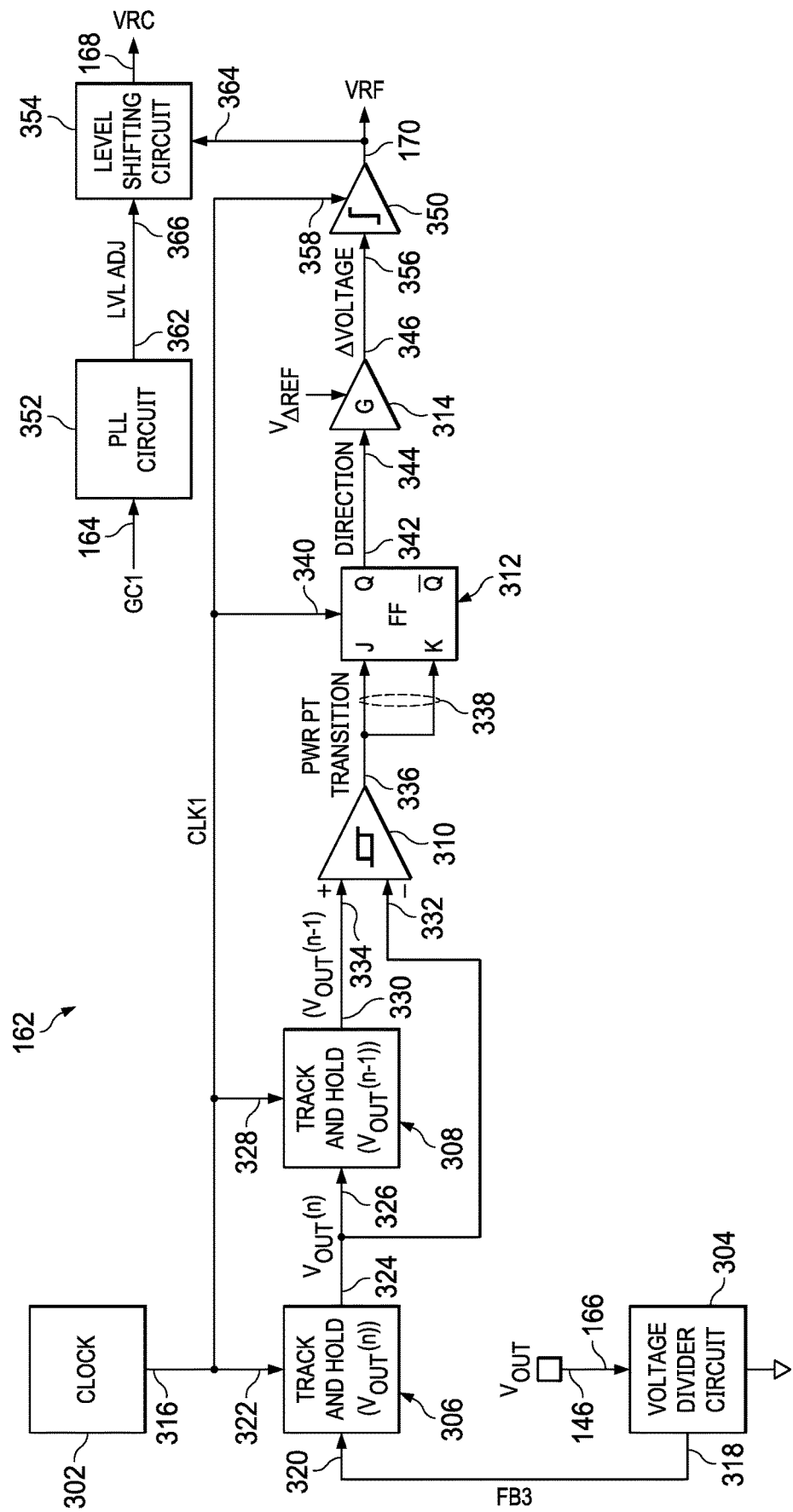
FIG. 3 is a schematic diagram of an example of an MPPT reference and window generator circuit.

FIG. 3 shows an example of the MPPT reference and window generator circuit 162, which includes a clock circuit 302 (labeled CLOCK in FIG. 3), a voltage divider circuit 304, a first sampling circuit 306, a second sampling circuit 308, a comparator circuit 310, a JK flip flop circuit 312, and a delta voltage generator circuit 314. The clock circuit 302 includes a clock output 316. The voltage divider circuit 304 includes the second DC voltage input 166 and a third output voltage feedback output 318. The first sampling circuit 306 includes a third output voltage feedback input terminal 320 coupled with the third output voltage feedback output 318, a first clock terminal 322 coupled to the clock output 316, and a voltage sample output terminal 324. The second sampling circuit 308 includes a voltage sample input terminal 326 coupled to the voltage sample output terminal 324, a second clock terminal 328 coupled to the clock output 316, and a previous voltage sample output terminal 330. The comparator circuit 310 includes a first sample input 332 coupled to the voltage sample output terminal 324, a second sample input 334 coupled to the previous voltage sample output terminal 330, and a power point transition output 336. The JK flip flop circuit 312 with J and K input terminals 338 coupled to the power point transition output 336, a third clock terminal 340 coupled to the clock output 316, and a JK output terminal 342. The delta voltage generator circuit 314 includes a direction input 344 coupled to the JK output terminal 342 and a delta voltage output 346.

The clock circuit 302 generates a first clock signal CLK1 at the clock output 316. In one example, the first clock signal CLK1 represents a square wave. In other examples, the first clock signal CLK1 includes a repetitive clock pulse with less than 50% duty cycle or any suitable duty cycle. The voltage divider circuit 304 receives the DC output voltage signal $V_{OUT}$ from the switching converter circuit 112 (e.g., FIG. 1). The voltage divider circuit 304 generates a third feedback signal FB3 based on the DC output voltage signal $V_{OUT}$. In one example, the DC output voltage signal $V_{OUT}$ is provided to the voltage divider circuit 302 from the DC voltage output 146 of the switching converter circuit 112.

The first sampling circuit 306 receives the third feedback signal FB3 from the voltage divider circuit 304 via the third output voltage feedback input terminal 320. The first clock terminal 322 receives the first clock signal CLK1 from the clock circuit 302. The first sampling circuit 306 samples the third feedback signal FB3 to form a present output voltage sample signal $V_{OUT}(n)$. The first sampling circuit 306 provides the present output voltage sample signal $V_{OUT}(n)$ to the voltage sample output terminal 324 in response to rising or falling transitions of the first clock signal CLK1.

The second sampling circuit 308 receives the present output voltage sample signal $V_{OUT}(n)$ from the first sampling circuit 306 via the voltage sample input terminal 326. The second clock terminal 328 receives the first clock signal CLK1 from the clock circuit 302. The second sampling circuit 308 samples the present output voltage sample signal $V_{OUT}(n)$ to form a previous output voltage sample signal $V_{OUT}(n-1)$. The second sampling circuit 308 provides the previous output voltage sample signal $V_{OUT}(n-1)$ to the previous voltage sample output terminal 330 in response to rising or falling transitions of the first clock signal CLK1.

The comparator circuit 310 receives the present output voltage sample signal $V_{OUT}(n)$ from the first sampling circuit 306. The comparator circuit 310 receives the previous output voltage sample signal $V_{OUT}(n-1)$ from the second sampling circuit 308. The comparator circuit 310 generates a power point transition signal PWR PT TRANSITION with a first condition (e.g., NO CHANGE in FIG. 4) indicating the present output voltage sample signal $V_{OUT}(n)$ is greater than the previous output voltage sample signal $V_{OUT}(n-1)$ and a second condition (e.g., TOGGLE in FIG. 4) indicating the present output voltage sample signal $V_{OUT}(n)$ is less than the previous output voltage sample signal $V_{OUT}(n-1)$.

The JK flip flop circuit 312 receives the power point transition signal PWR PT TRANSITION from the comparator circuit 310 at the J and K input terminals 338. The JK flip flop circuit 312 receives the first clock signal CLK1 from the clock circuit 302 at the third clock terminal 340. The JK flip flop circuit 312 generates a direction signal DIRECTION by setting the JK output terminal 342 to a first condition (e.g., INCREASE in FIG. 4) based on the first condition (e.g., NO CHANGE) of the power point transition signal PWR PT TRANSITION and to a second condition (e.g., DECREASE in FIG. 4) based on the second condition (e.g., TOGGLE) of the power point transition signal PWR PT TRANSITION.

The delta voltage generator circuit 314 receives the direction signal DIRECTION from the JK output terminal 342 of the JK flip flop circuit 312. The delta voltage generator circuit 314 generates a voltage change signal Δ VOLTAGE with a positive voltage based on the first condition (e.g., INCREASE) of the direction signal DIRECTION. The delta voltage generator circuit 314 generates the voltage change signal Δ VOLTAGE with a negative voltage based on the second condition (e.g., DECREASE) of the direction signal DIRECTION. The delta voltage generator circuit 314 receives a voltage change reference signal VAREF as a voltage source for the positive/negative voltages on the voltage change signal Δ VOLTAGE.

In another example, the clock circuit 302 operates such that a period for the first clock signal CLK1 is greater than 102 microseconds. In another example, the clock circuit 302 operates such that a period for the first clock signal CLK1 is greater than 125 microseconds. In another example, the clock circuit 302 operates such that a period for the first clock signal CLK1 is 128 microseconds. In other examples, the clock circuit 302 operates using any suitable period for the first clock signal CLK1. In another example, the first and second sampling circuits 306, 308 are track and hold circuits. In other examples, the first and second sampling circuit 306, 308 are sample and hold circuits or any suitable sampling circuits. In another example, the comparator circuit 310 applies hysteretic considerations such that noise on the $V_{OUT}(n)$ and $V_{OUT}(n-1)$ signals does not result in chatter between the first and second conditions (e.g., NO CHANGE, TOGGLE) of the power point transition signal PWR PT TRANSITION. In another example, the delta voltage generator circuit 314 operates such that an absolute value of the negative voltage for the voltage change signal Δ VOLTAGE is greater than a corresponding absolute value of the positive voltage for the voltage change signal Δ VOLTAGE. In another example, the positive/negative voltages for the voltage change signal Δ VOLTAGE have the same absolute value. In other examples, the absolute values of the positive and negative voltages for the voltage change signal Δ VOLTAGE are in any suitable relationship.

FIG. 3 shows the MPPT reference and window generator circuit 162, which also includes an integrator circuit 350, a phase lock loop (PLL) circuit 352, and a level shifting circuit 354. The integrator circuit 350 includes a delta voltage input 356 coupled to the delta voltage output 346, a clock input 358 coupled to the clock output 316, and the floor reference output 170. The PLL circuit 352 includes the first gate control input 164 and a level adjust output 362. The level shifting circuit 354 includes a second floor reference input 364 coupled to the floor reference output 170 of the integrator circuit 350, a level adjust input 366 coupled to the level adjust output 362, and the ceiling reference output 168.

The integrator circuit 350 receives the voltage change signal Δ VOLTAGE from the delta voltage generator circuit 314. The integrator circuit 350 receives the first clock signal CLK1 from the clock circuit 302. The integrator circuit 350 generates the floor reference signal VRF based on the voltage change signal Δ VOLTAGE and the first clock signal CLK1. The integrator circuit 350 adds the positive voltage of the voltage change signal Δ VOLTAGE to a previous reference floor signal in response to rising or falling transitions of the first clock signal CLK1. The integrator circuit 350 subtracts the negative voltage of the voltage change signal Δ VOLTAGE from the previous $V_{REF\ FLOOR}(n-1)$ signal in response to rising or falling transitions of the first clock signal CLK1 to form the floor reference signal VRF.

The PLL circuit 352 receives the first gate control signal GC1 from the power harvest controller circuit 104 (e.g., FIG. 1). The PLL circuit 352 generates a level adjust signal LVL ADJ in response to the first gate control signal GC1. The level shifting circuit 354 receives the floor reference signal VRF from the integrator circuit 350. The level shifting circuit 354 receives the level adjust signal LVL ADJ from the PLL circuit 352. The level shifting circuit 354 generates the ceiling reference signal VRC by shifting the floor reference signal VRF based on the level adjust signal LVL ADJ. In a further example, the PLL and level shifting circuits 352, 354 are configured to dynamically alter the shifting by changing the level adjust signal LVL ADJ to adapt a window between the $V_{REF\ FLOOR}(n)$ and ceiling reference signal VRC such that a desired pulse width for pulses on the first gate control signal GC1 (e.g., FIG. 1) is maintained over time.

In another example, the MPPT reference and window generator circuit 162 includes an integrator circuit, a PLL circuit, and a second voltage divider circuit. In this example, the integrator circuit receives the voltage change signal Δ VOLTAGE from the delta voltage generator circuit 314. The integrator circuit receives the first clock signal CLK1 from the clock circuit 302. The integrator circuit generates the ceiling reference signal VRC based on the voltage change signal Δ VOLTAGE and the first clock signal CLK1. The integrator circuit adds the positive voltage for the voltage change signal Δ VOLTAGE to a previous $V_{REF\ CEILING}(n-1)$ signal in response to rising or falling transitions of the first clock signal CLK1 and subtracts the negative voltage for the voltage change signal Δ VOLTAGE from the previous $V_{REF\ CEILING}(n-1)$ in response to rising or falling transitions of the first clock signal CLK1 to form the ceiling reference signal VRC.

In this example, the PLL circuit 352 receives the first gate control signal GC1 from the power harvest controller circuit 104 (e.g., FIG. 1). The PLL circuit 352 generates the level adjust signal LVL ADJ in response to the first gate control signal GC1. The second voltage divider circuit receives the ceiling reference signal VRC from the integrator circuit. The second voltage divider circuit receives the level adjust signal LVL ADJ from the PLL circuit 352. The second voltage divider circuit generates the floor reference signal VRF by attenuating the ceiling reference signal VRC based on the level adjust signal LVL ADJ. In a further example, the controller circuit 102 is configured to dynamically alter the attenuating by changing the level adjust signal LVL ADJ to adapt a window between the $V_{REF\ FLOOR}(n)$ and ceiling reference signal VRC such that a desired pulse width for pulses on the first gate control signal GC1 is maintained over time.

Figure 4:
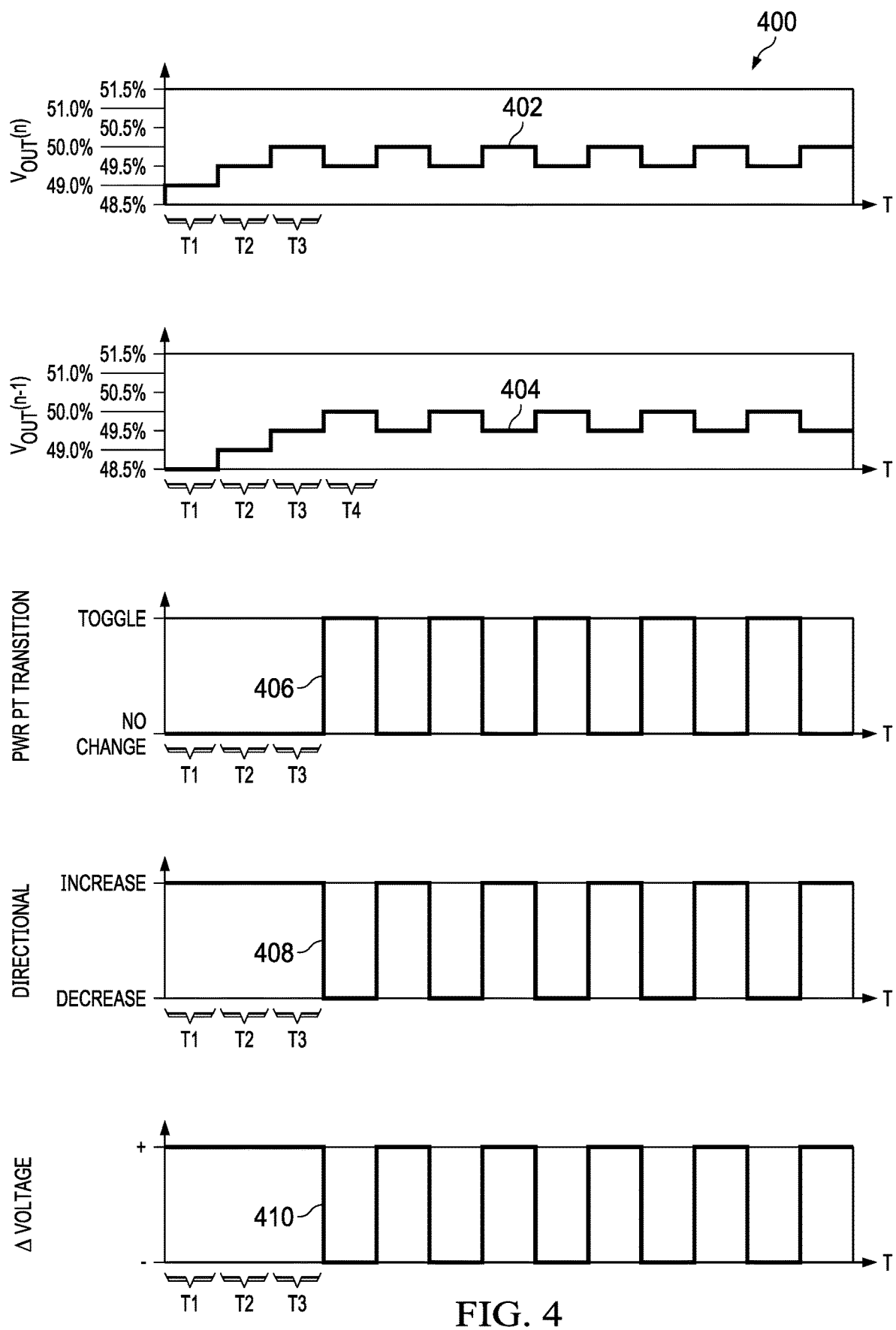
FIG. 4 is a timing diagram of an example of the timing of select signals shown in FIG. 3.

FIG. 4 shows a timing diagram 400 of an example of the timing of select signals shown in FIG. 3 in relation to operation of the MPPT reference and window generator circuit 162 (e.g., e.g., FIG. 1) during a brief daytime scenario in which the output power for the PV sub-module 100 rises toward an MPP which is then tracked. The MPPT reference and window generator circuit 162 generally experiences this scenario many times during daylight hours. However, the MPP changes in response to the amount of sunlight reaching the PV sub-module. For example, this brief daytime scenario is repeated each time the MPP increases with the MPPT reference and window generator circuit 162 tracking the output power and detecting the increased MPP. A similar daytime scenario (not shown) is repeated each time the MPP decreases with the MPPT reference and window generator circuit 162 tracking the output power and detecting the decreased MPP.

A curve 402 shows an example of the present output voltage sample signal $V_{OUT}(n)$ at the voltage sample output terminal 324 of the first sampling circuit 306 in the MPPT reference and window generator circuit 162. The present output voltage sample signal $V_{OUT}(n)$ is provided to the second sampling and comparator circuits 308, 310. The present output voltage sample signal $V_{OUT}(n)$ is an analog signal that reflects the third feedback signal FB3 at the third output voltage feedback input terminal 320 of the first sampling circuit 306 at each pulse of the first clock signal CLK1 at the first clock terminal 324 of the first sampling circuit 306. Thus, the plotted present output voltage sample signal $V_{OUT}(n)$ 402 generally tracks the DC output voltage signal $V_{OUT}$ provided to the voltage divider circuit 304 from the switching converter circuit 112. The third feedback signal FB3 from the voltage divider circuit 304 is a representation of the DC output voltage signal $V_{OUT}$. In this example, the present output voltage sample signal $V_{OUT}(n)$ curve 402 shows a first clock cycle (T1) in which the third feedback signal FB3 rose from 48.5 percent to 49 percent, a second clock cycle (T2) in which the third feedback signal FB3 rose from 49 percent to 49.5 percent, and a third clock cycle (T3) in which the third feedback signal FB3 rose from 49.5 percent to 50 percent. In this example, 49.5 percent is the MPP and subsequent clock cycles show the present output voltage sample signal $V_{OUT}(n)$ oscillating between 49.5 and 50 percent. The present output voltage sample signal $V_{OUT}(n)$ at the voltage sample output terminal 324 of the first sampling circuit 306 is shown as an analog signal in linear portions with sharp transitions based on clock pulses to simplify the discussion herein. In one implementation, the present output voltage sample signal $V_{OUT}(n)$ includes a residual noise level and may exhibit curves and smooth transitions rather than the linear portions with sharp transitions. In other examples, the MPP may be higher or lower than 49.5 percent depending on the amount of sunlight received by the PV sub-module 100. For example, during a sunrise-to-sunset scenario, the MPP starts low at sunrise, increases toward midday, and decreases toward sunset.

A curve 404 shows an example of the previous output voltage sample signal $V_{OUT}(n-1)$ at the previous voltage sample output terminal 330 of the second sampling circuit 308 in the MPPT reference and window generator circuit 162. The previous output voltage sample signal $V_{OUT}(n-1)$ is provided to the comparator circuit 310. The previous output voltage sample signal $V_{OUT}(n-1)$ is an analog signal that reflects the present output voltage sample signal $V_{OUT}(n)$ at the voltage sample input terminal 326 of the second sampling circuit 308 at each pulse of the first clock signal CLK1 at the second clock terminal 328 of the second sampling circuit 308. Thus, the plotted previous output voltage sample signal $V_{OUT}(n-1)$ 402 generally tracks the previous value of the DC output voltage signal $V_{OUT}$ in relation to the first sampling circuit 306 tracking the current value of the DC output voltage signal $V_{OUT}$. In this example, the plotted previous output voltage sample signal $V_{OUT}(n-1)$ 402 shows a first clock cycle (T1) in which the previous output voltage sample signal $V_{OUT}(n-1)$ starts at 48.5 percent, a second clock cycle (T2) in which the previous output voltage sample signal $V_{OUT}(n-1)$ rose from 48.5 percent to 49 percent, a third clock cycle (T3) in which the previous output voltage sample signal $V_{OUT}(n-1)$ from 49 percent to 49.5 percent, and a fourth clock cycle (T4) in which the previous output voltage sample signal $V_{OUT}(n-1)$ rose from 49.5 percent to 50 percent. In this example, 49.5 percent is the MPP and subsequent clock cycles show the previous output voltage sample signal $V_{OUT}(n-1)$ oscillating between 49.5 and 50 percent. The previous output voltage sample signal $V_{OUT}(n-1)$ at the previous voltage sample output terminal 330 of the second sampling circuit 306 is shown as an analog signal in linear portions with sharp transitions based on clock pulses to simplify the discussion herein. In one implementation, the previous output voltage sample signal $V_{OUT}(n-1)$ includes a residual noise level and may exhibit curves and smooth transitions rather than the linear portions with sharp transitions. In other examples, the MPP may be higher or lower than 49.5 percent depending on the amount of sunlight received by the PV sub-module 100. For example, during a sunrise-to-sunset scenario, the MPP starts low at sunrise, increases toward midday, and decreases toward sunset.

A curve 406 shows an example of the power point transition signal PWR PT TRANSITION generated by the comparator circuit 310 of the MPPT reference and window generator circuit 162. The power point transition signal PWR PT TRANSITION is provided to the J and K input terminals 338 of the JK flip flop circuit 312. The power point transition signal PWR PT TRANSITION is a digital signal that varies between "NO CHANGE" and "TOGGLE" conditions. The comparator circuit 310 sets the power point transition signal PWR PT TRANSITION to the "NO CHANGE" condition if the present output voltage sample signal $V_{OUT}(n)$ is greater than the previous output voltage sample signal $V_{OUT}(n-1)$. If the present output voltage sample signal $V_{OUT}(n)$ is less than the previous output voltage sample signal $V_{OUT}(n-1)$, the comparator circuit 310 sets the power point transition signal PWR PT TRANSITION to the "TOGGLE" condition. In this example, the present output voltage sample signal $V_{OUT}(n)$ is greater than the previous output voltage sample signal $V_{OUT}(n-1)$ during the first three clock cycles (T1, T2, T3). Thus, the power point transition signal PWR PT TRANSITION is set to the "NO CHANGE" condition during the first three clock cycles (T1, T2, T3). In this example, 49.5 percent is the MPP and subsequent clock cycles show the present output voltage sample signal $V_{OUT}(n)$ oscillating between being less than and greater than the previous output voltage sample signal $V_{OUT}(n-1)$. Accordingly, the power point transition signal PWR PT TRANSITION switches between the "TOGGLE" and "NO CHANGE" conditions during subsequent clock cycles. The power point transition signal PWR PT TRANSITION from the comparator circuit 310 is shown as a digital signal in linear portions with sharp transitions to simplify the discussion herein. In one implementation, the power point transition signal PWR PT TRANSITION includes a residual noise level and may exhibit curves and smooth transitions rather than the linear portions with sharp transitions.

A curve 408 shows an example of the direction signal DIRECTION generated by the JK flip flop circuit 312 of the MPPT reference and window generator circuit 162. The direction signal DIRECTION is provided to the delta voltage generator circuit 314. The direction signal DIRECTION is a digital signal that varies between "INCREASE" and "DECREASE" conditions. The JK flip flop circuit 312 changes the direction signal DIRECTION from the "INCREASE" condition to the "DECREASE" condition if the power point transition signal PWR PT TRANSITION at the J and K inputs 338 is set to the "TOGGLE" condition. The JK flip flop circuit 312 continues toggling its JK output terminal 342 between the "INCREASE" and "DECREASE"

conditions while the power point transition signal PWR PT TRANSITION is set to the "TOGGLE" conditions. If the power point transition signal PWR PT TRANSITION at the J and K inputs 338 of the JK flip flop circuit 312 is set to the "NO CHANGE" condition, the JK flip flop circuit 312 does not change the condition of direction signal DIRECTION at its JK output terminal 342. In this example, the direction signal DIRECTION is set to the "INCREASE" condition during the first three clock cycles (T1, T2, T3) while the power point transition signal PWR PT TRANSITION is set to the "NO CHANGE" condition. During subsequent clock cycles, the direction signal DIRECTION switches between the "DECREASE" and "INCREASE" conditions while the power point transition signal PWR PT TRANSITION switches between the "TOGGLE" and "NO CHANGE" conditions. The direction signal DIRECTION from the JK flip flop circuit 312 is shown as a digital signal in linear portions with sharp transitions to simplify the discussion herein. In one implementation, the direction signal DIRECTION includes a residual noise level and may exhibit curves and smooth transitions rather than the linear portions with sharp transitions.

A curve 410 shows an example of the voltage change signal Δ VOLTAGE generated by the delta voltage generator circuit 314 of the MPPT reference and window generator circuit 162. The voltage change signal Δ VOLTAGE is provided to the integrator circuit 350. The voltage change signal Δ VOLTAGE is an analog signal that varies between "+" and "−" conditions. The delta voltage generator circuit 314 outputs a positive voltage for the voltage change signal Δ VOLTAGE if the direction signal DIRECTION received from the from the JK flip flop circuit 312 is set to the "INCREASE" condition. The delta voltage generator circuit 314 outputs a negative voltage for the voltage change signal Δ VOLTAGE if the direction signal DIRECTION received from the from the JK flip flop circuit 312 is set to the "DECREASE" condition. In this example, the voltage change signal Δ VOLTAGE is set to the "+" condition during the first three clock cycles (T1, T2, T3) while the direction signal DIRECTION is set to the "INCREASE" condition. During subsequent clock cycles, the voltage change signal Δ VOLTAGE switches between the "−" and "+" conditions while the direction signal DIRECTION switches between the "DECREASE" and "INCREASE" conditions. The voltage change signal Δ VOLTAGE from the delta voltage generator circuit 314 is shown as an analog signal in linear portions with sharp transitions to simplify the discussion herein. In one implementation, the voltage change signal Δ VOLTAGE includes a residual noise level and may exhibit curves and smooth transitions rather than the linear portions with sharp transitions.

Figure 5:
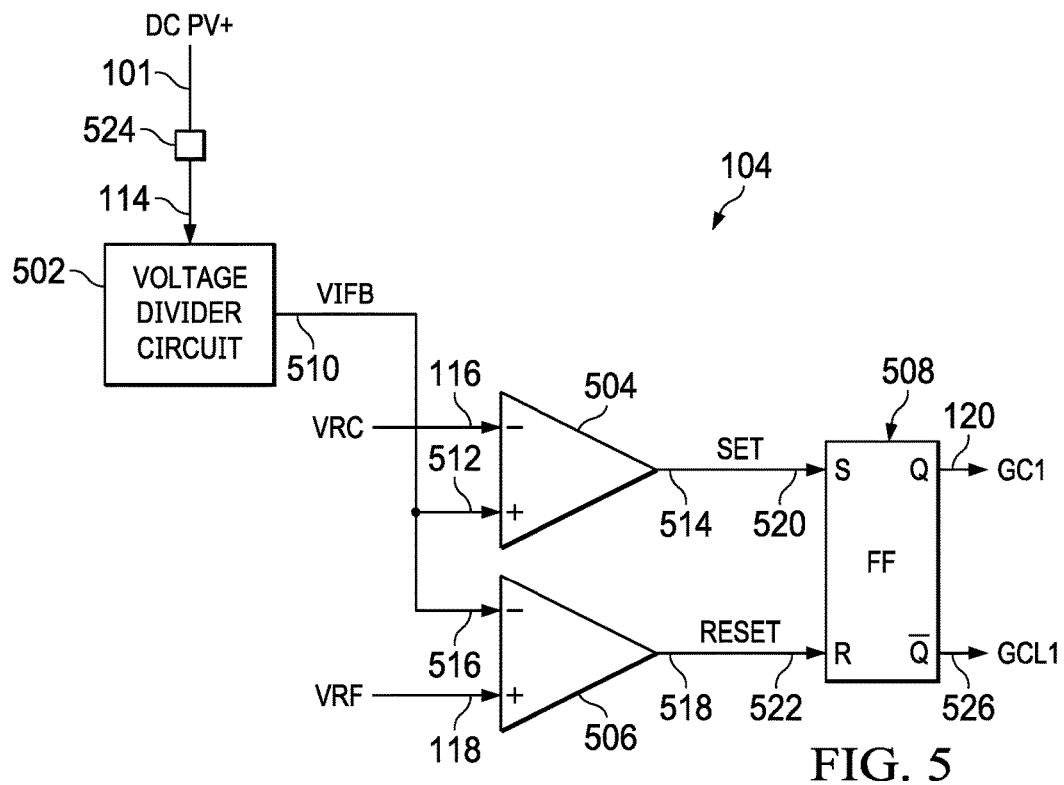
FIG. 5 is a schematic diagram of an example of a power harvest controller circuit.

FIG. 5 shows an example of the power harvest controller circuit 104, which includes a voltage divider circuit 502, a first comparator circuit 504, a second comparator circuit 506, and an SR flip flop circuit 508. The voltage divider circuit 502 includes the first PV voltage input 114 and an input voltage feedback output 510. The first comparator circuit 504 includes a first input voltage feedback input 512 coupled with the input voltage feedback output 510, the ceiling reference input 116, and a set output 514. The second comparator circuit 506 includes a second input voltage feedback input 516 coupled to the input voltage feedback output 510, the floor reference input 118, and a reset output 518. The SR flip flop circuit 508 includes a set input terminal 520 coupled to the set output 514, a reset input terminal 522 coupled to the reset output 518, and the first gate control output 120.

The voltage divider circuit 502 receives the first DC string voltage signal DC PV+ from the string of PV cells 148 (e.g., FIG. 1). The voltage divider circuit 502 generates an input voltage feedback signal VIFB based on the first DC string voltage signal DC PV+. In one example, the first DC string voltage signal DC PV+ is provided to the voltage divider circuit 502 from the string of PV cells 148 via IC terminal DC PV+ 524. The first comparator circuit 504 receives the input voltage feedback signal VIFB from the voltage divider circuit 502. The first comparator circuit 504 receives the ceiling reference signal VRC. The first comparator circuit 504 generates a set signal SET based on the input voltage feedback signal VIFB and the ceiling reference signal VRC. The second comparator circuit 506 receives the input voltage feedback signal VIFB from the voltage divider circuit 502. The second comparator circuit 506 receives the floor reference signal VRF. The second comparator circuit 506 generates a reset signal RESET based on the input voltage feedback signal VIFB and the floor reference signal VRF.

The SR flip flop circuit 508 receives the set signal SET from the first comparator circuit 504 at the set input terminal 520. The SR flip flop circuit 508 receives the reset signal RESET from the second comparator circuit 506 at the reset input terminal 522. The SR flip flop circuit 508 generates the first gate control signal GC1 by setting the first gate control output 120 (first SR output terminal) to a first condition (e.g., 1) in response to the set signal SET and by setting the first gate control output 120 (first SR output terminal) to a second condition (e.g., 0) in response to the reset signal RESET. In a further example, the SR flip flop circuit 508 includes a second SR output terminal 526. In this example, the first gate control signal GC1 includes the first gate control signal GC1 and a first low gate control signal. The SR flip flop circuit 508 generates the first gate control and first low gate control signals by setting the first SR output terminal (first gate control output 120) to the first condition (e.g., 1) and the second SR output terminal 526 (first low gate control output) to the second condition (e.g., 0) in response to the set signal SET and by setting the first SR output terminal (first gate control output 120) to the second condition (e.g., 0) and the second SR output terminal 526 (first low gate control output) to the first condition (e.g., 1) in response to the reset signal RESET.

Figure 6:
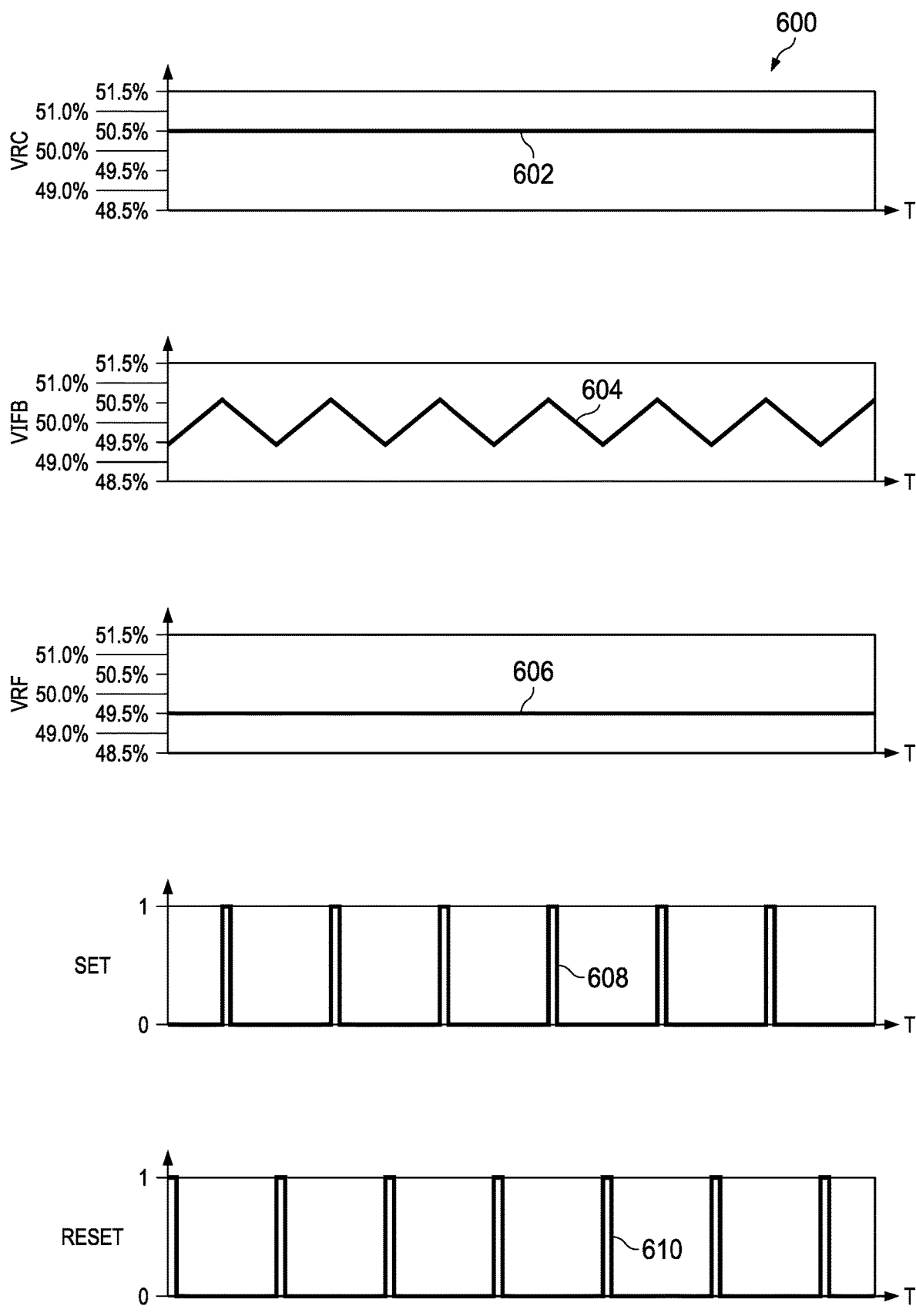
FIG. 6 is a timing diagram of an example of the timing of select signals shown in FIG. 5.

FIG. 6 shows a timing diagram 600 of an example of the timing of select signals shown in FIG. 5 in relation to operation of the power harvest controller circuit 104 (e.g., e.g., FIG. 1) during a brief daytime scenario in which the output power for the PV sub-module 100 is relatively stable at 50 percent and the $V_{REF\ FLOOR}(n)$ and ceiling reference signal VRC are relatively stable at 49.5 and 50.5 percent. The power harvest controller circuit 104 generally experiences this scenario many times during daylight hours. However, the MPP changes in response to the amount of sunlight reaching the PV sub-module. For example, this brief daytime scenario is repeated each time the output power for the PV sub-module 100 stabilizes after the MPP increases or decreases.

A curve 602 shows an example of the ceiling reference signal VRCVRC provided by the MPPT reference and window generator circuit 162 to the first comparator circuit 504 of the power harvest controller circuit 104. The ceiling reference signal VRC is an analog signal that reflects an upper reference limit for the input voltage feedback signal VIFB that represents the first DC string voltage signal DC PV+. The MPPT reference and window generator circuit 162 varies the value of the ceiling reference signal VRC in conjunction with tracking the DC output voltage signal $V_{OUT}$ and identifying the MPP. In this example, the MPP is stabilized at 50 percent and the ceiling reference signal VRC is stabilized at 50.5 percent. The ceiling reference signal VRC received by the first comparator circuit 504 is shown as an analog signal in a linear segment to simplify the discussion herein. In one implementation, the ceiling reference signal VRC includes a residual noise level and may exhibit curves and smooth transitions rather that the linear segment. In other examples, the ceiling reference signal VRC may be higher or lower than 50.5 percent when the MPP is 50 percent. Similarly, in other examples, the MPP may be higher or lower than 50 percent with the ceiling reference signal VRC being higher or lower in corresponding relation to the MPP. For example, at sunrise the first DC string voltage signal DC PV+ starts at zero (0) percent, increases toward midday, and decreases toward zero (0) percent at sunset. The ceiling reference signal VRC and MPP increase and decrease over a sunrise-to-sunset scenario in similar fashion. The ceiling reference signal VRC, which corresponds to the DC output voltage signal $V_{OUT}$ and the MPP, is higher than the input voltage feedback signal VIFB.

A curve 604 shows an example of the input voltage feedback signal VIFB generated by the voltage divider circuit 502 of the power harvest controller circuit 104. The input voltage feedback signal VIFB is provided to the first and second comparator circuits 504, 506 of the power harvest controller circuit 104. The input voltage feedback signal VIFB is an analog signal that represents the first DC string voltage signal DC PV+ received by the voltage divider circuit 502 from the string of PV cells 148. In this example, the DC output voltage signal $V_{OUT}$, MPP, and first DC string voltage signal DC PV+ are generally stabilized at 50 percent. In this example, the plotted input voltage feedback signal VIFB 604 exhibits a triangle pattern that rises from 49.5 percent to 50.5 percent and falls back to 49.5 percent in a repetitive fashion. The 50.5 percent level is established by the ceiling reference signal VRC and the 49.5 percent level is established by the floor reference signal VRF in this example. For example, when the first DC string voltage signal DC PV+ is at 49.5 percent, the output from the string of PV cells 148 is disconnected from the DC output voltage signal $V_{OUT}$ by the switching converter circuit 112 and the first DC string voltage signal DC PV+ begins increasing due to the open circuit condition. When the first DC string voltage signal DC PV+ reaches 50.5 percent, the ceiling reference signal VRC causes the output from the string of PV cells 148 to be coupled to the DC output voltage signal $V_{OUT}$ and the first DC string voltage signal DC PV+ begins decreasing due to the loaded circuit condition. When the first DC string voltage signal DC PV+ reaches 49.5 percent, the floor reference signal VRF causes the output from the string of PV cells 148 to be disconnected from the DC output voltage signal $V_{OUT}$ by the switching converter circuit 112. This process is repeated over time which forms the triangle pattern for the input voltage feedback signal VIFB. The input voltage feedback signal VIFB is shown as an analog signal with a triangle pattern formed by linear rising and falling portions with sharp transitions to simplify the discussion herein. In one implementation, the input voltage feedback signal VIFB includes a residual noise level and may exhibit curves and smooth transitions rather than the linear rising and falling portions with sharp transitions. The timing of the rising and falling portions of the input voltage feedback signal VIFB may be different in any particular cycle. In other examples, the DC output voltage signal $V_{OUT}$, MPP, and first DC string voltage signal DC PV+ may be stabilized at a higher or lower level than 50 percent. Similarly, in other examples, the margin between the ceiling reference signal VRC and the floor reference signal VRF and the input voltage feedback signal VIFB may be more or less than 0.5 percent. The ceiling reference signal VRC is higher than the input voltage feedback signal VIFB and the floor reference signal VRF is lower than the input voltage feedback signal VIFB.

A curve 606 shows an example of the floor reference signal VRF provided by the MPPT reference and window generator circuit 162 to the second comparator circuit 506 of the power harvest controller circuit 104. The floor reference signal VRF is an analog signal that reflects a lower reference limit for the input voltage feedback signal VIFB. The MPPT reference and window generator circuit 162 varies the value of the floor reference signal VRF in conjunction with tracking the DC output voltage signal $V_{OUT}$ and identifying the MPP. In this example, the MPP is stabilized at 50 percent and the floor reference signal VRF is stabilized at 49.5 percent. The floor reference signal VRF received by the second comparator circuit 506 is shown as an analog signal in a linear segment to simplify the discussion herein. In one implementation, the ceiling reference signal VRC includes a residual noise level may exhibit curves and smooth transitions rather that the linear segment. In other examples, the floor reference signal VRF may be higher or lower than 49.5 percent when the MPP is 50 percent. Similarly, in other examples, the MPP may be higher or lower than 50 percent with the floor reference signal VRF being higher or lower in corresponding relation to the MPP. For example, at sunrise the first DC string voltage signal DC PV+ starts at zero (0) percent, increases toward midday, and decreases toward zero (0) percent at sunset. The floor reference signal VRF and MPP increase and decrease over a sunrise-to-sunset scenario in similar fashion. The floor reference signal VRF, which corresponds to the DC output voltage signal $V_{OUT}$ and the MPP, is lower than the input voltage feedback signal VIFB.

A curve 608 shows an example of the set signal SET generated by the first comparator circuit 504 of the power harvest controller circuit 104. The set signal SET is provided to the set input terminal 520 of the SR flip flop circuit 508. The set signal SET is a digital signal that varies between "0" and "1" conditions. In this example, the first comparator circuit 504 sets the set signal SET to the "1" condition when the input voltage feedback signal VIFB reaches the ceiling reference signal VRC and to the "0" condition when the input voltage feedback signal VIFB is less than the ceiling reference signal VRC. Thus, the set signal SET in this example begins in the "0" condition because the input voltage feedback signal VIFB begins at 49.5 percent and switches to the "1" condition when the input voltage feedback signal VIFB reaches 50.5 percent. Based on the timing of the input voltage feedback signal VIFB, the set signal SET briefly switches to the "1" condition each time the input voltage feedback signal VIFB reaches 50.5 percent. Thus, the set signal SET is in the "0" condition during most of the triangle pattern for the input voltage feedback signal VIFB and briefly in the "1" condition during the highest points of the triangle pattern. The set signal SET generated by the first comparator circuit 504 is shown as a digital signal in linear portions with sharp transitions to simplify the discussion herein. In one implementation, the set signal SET includes a residual noise level and may exhibit curves and smooth transitions rather than the linear portions with sharp transitions.

A curve 610 shows an example of the reset signal RESET generated by the second comparator circuit 506 of the power harvest controller circuit 104. The reset signal RESET is provided to the reset input terminal 522 of the SR flip flop circuit 508. The reset signal RESET is a digital signal that varies between "0" and "1" conditions. In this example, the second comparator circuit 506 sets the reset signal RESET to the "1" condition when the input voltage feedback signal VIFB reaches the floor reference signal VRF and to the "0" condition when the input voltage feedback signal VIFB is greater than the floor reference signal VRF. Thus, the reset signal RESET in this example begins in the "1" condition because the input voltage feedback signal VIFB begins at 49.5 percent and switches to the "0" condition when the input voltage feedback signal VIFB becomes greater than 49.5 percent. Based on the timing of the input voltage feedback signal VIFB, the reset signal RESET briefly switches to the "1" condition each time the input voltage feedback signal VIFB reaches 49.5 percent. Thus, the reset signal RESET is in the "0" condition during most of the triangle pattern for the input voltage feedback signal VIFB and briefly in the "1" condition during the lowest points of the triangle pattern. The reset signal RESET generated by the second comparator circuit 506 is shown as a digital signal in linear portions with sharp transitions to simplify the discussion herein. In one implementation, the reset signal RESET includes a residual noise level and may exhibit curves and smooth transitions rather than the linear portions with sharp transitions.

Figure 7:
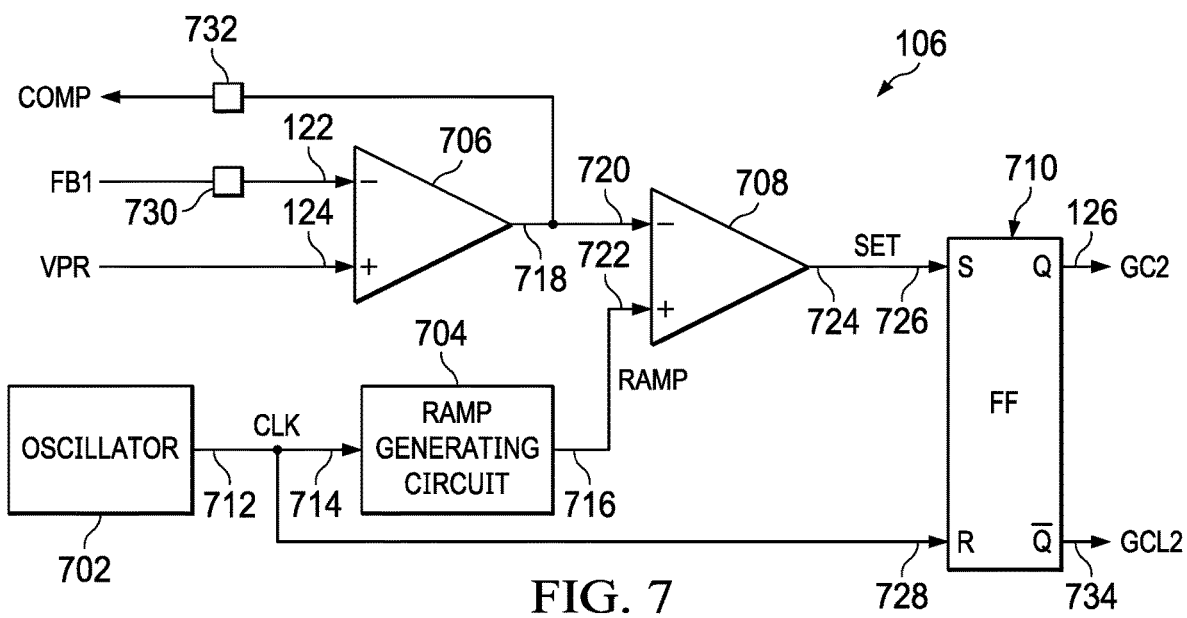
FIG. 7 is a schematic diagram of an example of a voltage limit controller circuit.

FIG. 7 shows an example of the voltage limit controller circuit 106, which includes an oscillator circuit 702, a ramp generator circuit 704, an error amplifier circuit 706, a comparator circuit 708, and an SR flip flop circuit 710. The oscillator circuit 702 includes a clock output 712. The ramp generator circuit 704 includes a clock input 714 coupled to the clock output 712 and a waveform output 716. The error amplifier circuit 706 includes the pulse width reference input 124, the first output voltage feedback input 122, and a compensation output 718. The comparator circuit 708 includes a first input 720 coupled to the compensation output 718, a second input 722 coupled to the waveform output 716, and a set output 724. The SR flip flop circuit 710 includes a set input terminal 726 coupled to the set output 724, a reset input terminal 728 coupled to the clock output 712, and the second gate control output 126.

The oscillator circuit 702 generates a clock signal CLK. In one example, the clock signal CLK operates at 1 MHz. In other examples, the clock signal CLK operates at other frequencies that are suitable for achieving a desired DC output voltage signal $V_{OUT}$ from the PV sub-module 100 (e.g., FIG. 1). The ramp generator circuit 704 receives the clock signal CLK from the oscillator circuit 702. The ramp generator circuit 704 generates a ramp signal RAMP that repeatedly ramps from a first predetermined amplitude to a second predetermined amplitude based on the clock signal CLK.

The error amplifier circuit 706 receives the first feedback signal FB1. The error amplifier circuit 706 receives the PWM reference signal VPR. The error amplifier circuit 706 generates a compensation signal COMP based on a difference between the PWM reference signal VPR and the first feedback signal FB1. In one example, the first feedback signal FB1 is provided to the error amplifier 706 from the voltage divider circuit 152 (e.g., FIG. 1) via a terminal 730. In one example, the compensation signal COMP is provided from the error amplifier 706 to the voltage divider circuit 152 via a terminal 732. The comparator circuit 706 receives the compensation signal COMP from the error amplifier circuit 706. The comparator circuit 706 receives the ramp signal RAMP from the ramp generator circuit 704. The comparator circuit 706 generates the set signal SET based on the compensation signal COMP and the ramp waveform.

The SR flip flop circuit 710 receives the set signal SET from the comparator circuit 708 at the set input terminal 726. The SR flip flop circuit 710 receives the clock signal CLK from the oscillator circuit 702 at the reset input terminal 728. The SR flip flop circuit 710 generates the second gate control signal GC2 by setting the second gate control output 126 (first SR output terminal) to a first condition (e.g., 1) in response to the set signal SET and by setting the second gate control output 126 (first SR output terminal) to a second condition (e.g., 0) in response to the clock signal CLK.

In a further example, the SR flip flop circuit 710 includes a second SR output terminal 734. In this example, the second gate control signal includes a high side second gate control signal GC2 and a second (e.g., low side) second gate control signal GCL2. The SR flip flop circuit 710 generates the second gate control and second low gate control signals by setting the first SR output terminal (second gate control output 126) to the first condition (e.g., 1) and the second SR output terminal 734 (second low gate control output) to the second condition (e.g., 0) in response to the set signal SET and by setting the first SR output terminal (first gate control output 120) to the second condition (e.g., 0) and the second SR output terminal 734 (second low gate control output) to the first condition (e.g., 1) in response to the clock signal CLK.

Figure 8:
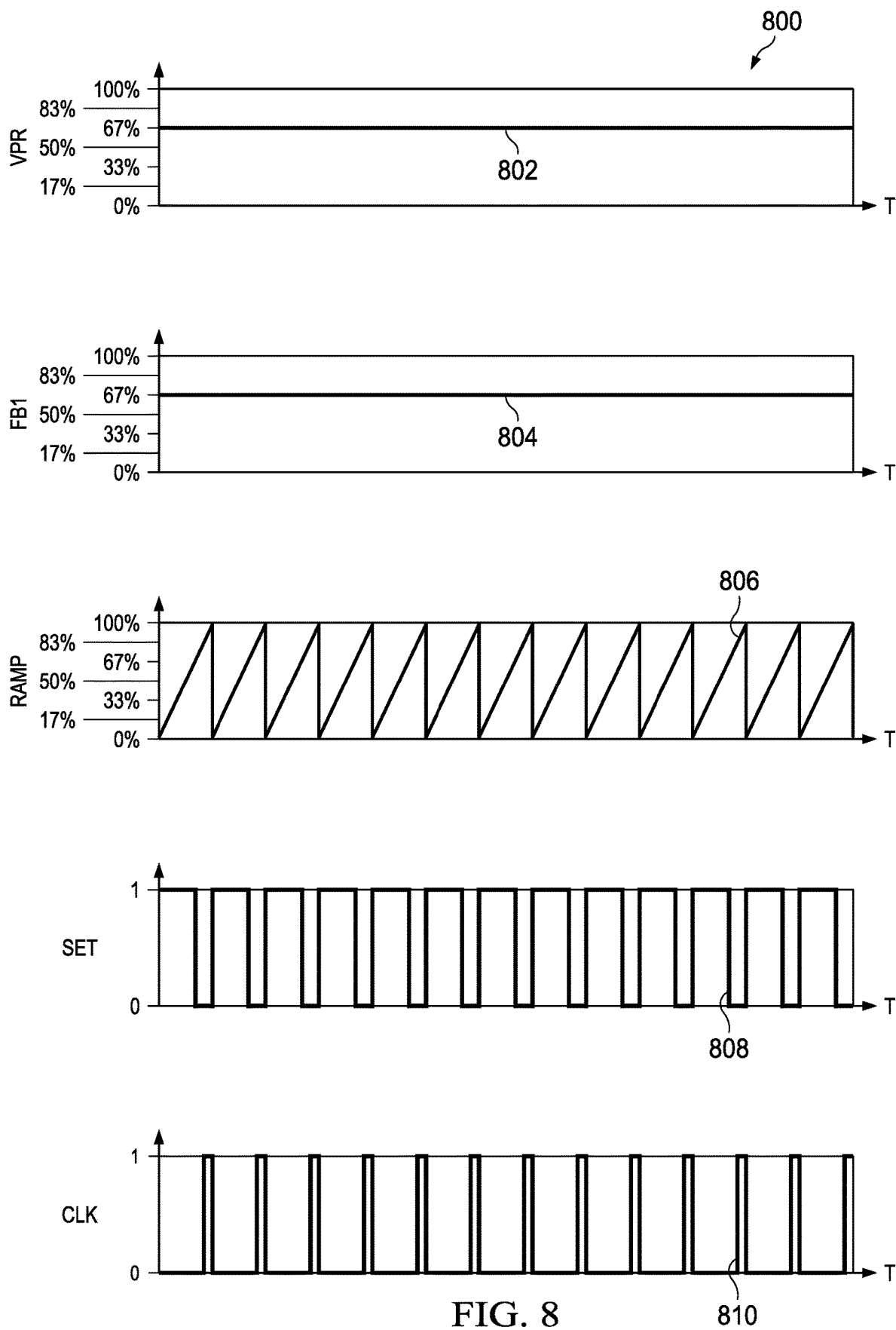
FIG. 8 is a timing diagram of an example of the timing of select signals shown in FIG. 7.

FIG. 8 shows a timing diagram 800 of an example of the timing of select signals shown in FIG. 7 in relation to operation of the voltage limit controller circuit 106 (e.g., e.g., FIG. 1) during a brief daytime scenario in which the output power for the PV sub-module 100 is relatively stable (e.g., 67 percent) and the PWM reference signal VPR and the first feedback signal FB1 are also relatively stable (e.g., 67 percent). The voltage limit controller circuit 106 generally experiences this scenario when the PV sub-module 100 is fully exposed to the sun. For example, this brief daytime scenario may be for an extended period at midday and may be repeated each day. However, if the PV sub-module 100 is not fully exposed to the sun, there may be days in which this scenario does not occur.

A curve 802 shows the PWM reference signal (VPR) provided to the error amplifier circuit 706 of the voltage limit controller circuit 106. The PWM reference signal VPR in one example is an analog signal that reflects a predetermined maximum power threshold for the first feedback signal FB1. The maximum power threshold may be adjustable to accommodate a variety of installations for the PV sub-module 100. However, after the PV sub-module 100 is installed and the maximum power threshold is adjusted to a desired limit, the maximum power threshold may not need to be re-adjusted unless the PV sub-module 100 is moved or there are changes to the environmental conditions (e.g., buildings, trees, or other structures that block or filter sunlight on the PV sub-module 100). In this example, the PWM reference signal VPR shows that the maximum power threshold is adjusted to 67 percent. The PWM reference signal curve 802 VPR is shown as an analog signal in a linear segment to simplify the discussion herein. In one implementation, the PWM reference signal VPR includes a residual noise level and may exhibit curves and smooth transitions rather that the linear segment. In other examples, the PWM reference signal VPR may be adjusted to be higher or lower than 67 percent.

A curve 802 shows an example of the first feedback signal FB1 provided by the voltage divider circuit 152 to the error amplifier circuit 706. The first feedback signal FB1 is an analog signal that represents the DC output voltage signal $V_{OUT}$ received by the voltage divider circuit 152 from the switching converter circuit 112. In this example, the DC output voltage signal $V_{OUT}$ and first feedback signal FB1 are generally stabilized at 67 percent. The first feedback signal FB1 is shown as an analog signal in a linear segment to simplify the discussion herein. In one implementation, the first feedback signal FB1 includes a residual noise level and may exhibit curves and smooth transitions rather that the linear segment. In other examples, the DC output voltage signal $V_{OUT}$ and first feedback signal FB1 may be stabilized at a higher or lower level than 67 percent. For example, at sunrise the first DC string voltage signal DC PV+ starts at zero (0) percent, increases toward midday, and decreases toward zero (0) percent at sunset. The DC output voltage signal $V_{OUT}$ and first feedback signal FB1 increase and decrease over a sunrise-to-sunset scenario in similar fashion.

A curve 806 shows an example of the ramp signal RAMP generated by the ramp generator circuit 704 of the voltage limit controller circuit 106. The ramp signal RAMP is provided to the comparator circuit 708 of the voltage limit controller circuit 106. The analog output signal from the ramp generator circuit 704 repeatedly ramps from a first predetermined amplitude to a second predetermined amplitude based on a clock signal CLK from the oscillator 702. This process forms the sawtooth pattern for the ramp signal RAMP 806. The ramp signal RAMP is shown as a sawtooth pattern formed by linear ramping and falling portions with sharp transitions to simplify the discussion herein. In one implementation, the ramp signal RAMP includes a residual noise level and may exhibit curves and smooth transitions rather than the linear ramping and falling portions with sharp transitions.

A curve 808 shows an example of the set signal SET generated by the comparator circuit 708 of the voltage limit controller circuit 106. The set signal SET is provided to the set input terminal 726 of the SR flip flop circuit 710. The set signal SET is a digital signal that varies between "0" and "1" conditions. The comparator circuit 708 sets the set signal SET to the "1" condition when the level of the ramp signal RAMP is less than the first feedback signal FB1 and to the "0" condition when the level of the ramp signal RAMP is greater than the first feedback signal FB1. In this example, the set signal SET begins in the "1" condition because the ramping portion of the ramp signal RAMP starts at zero (0) percent. The "1" condition for the set signal SET continues in this example until the ramping portion reaches 67 percent. After the ramping portion of the ramp signal RAMP increases beyond 67 percent, the comparator circuit 708 switches the set signal SET to the "0" condition where it remains until the ramp generator circuit 704 resets the ramp signal RAMP to zero (0) percent. At this point, the switching of the set signal SET is repeated based on the ramping and falling portions of the ramp waveform, the 67 percent level of the PWM reference signal VPR, and the first feedback signal FB1 being stabilized at 67 percent. In this example, the duty cycle of the set signal SET is 67 percent. The set signal SET generated by the comparator circuit 708 is shown as a digital pulse in linear portions with sharp transitions to simplify the discussion herein. In one implementation, the set signal SET includes a residual noise level and may exhibit curves and smooth transitions rather than the linear portions with sharp transitions. In other examples, the 67 percent levels may be higher or lower.

A curve 810 shows an example of the clock signal CLK generated by the oscillator circuit 702 of the voltage limit controller circuit 106. The clock signal CLK is provided to the reset input terminal 728 of the SR flip flop circuit 710. The clock signal CLK is also used as a clock signal CLK for the ramp generation circuit 704 in conjunction with triggering the ramp signal RAMP to be reset to zero (0) percent. The clock signal CLK is a digital signal that varies between "0" and "1" conditions. The oscillator circuit 708 switches the set signal SET between the "0" and "1" conditions based on the frequency of the clock signal CLK. In this example, the pulse on the clock signal CLK has a short duty cycle with the rising edge switching the clock signal CLK at the reset input terminal 728 to the "1" condition and the falling edge triggering the ramp signal RAMP to reset and switch the clock signal CLK at the reset input terminal 728 to the "0" condition. The short duty cycle for the clock signal CLK causes the "1" condition of the clock signal CLK at the reset input terminal 728 to occur during the "0" condition of the set signal SET. In this example, the clock signal CLK begins in the "0" condition. The "0" condition for the clock signal CLK at the reset input terminal 728 continues in this example until the pulse on the clock signal CLK of the oscillator circuit 702 switches the clock signal CLK to the "1" condition. The falling edge of the clock signal CLK switches the clock signal CLK at the reset input terminal 728 back to the "0." At this point, the switching of the clock signal CLK at the reset input terminal 728 is repeated in accordance with the pulses on the clock signal CLK. In this example, the duty cycle of the clock signal CLK at the reset input terminal 728 is based on the duty cycle of pulses on the clock signal CLK. The clock signal CLK generated by the oscillator circuit 702 is shown as a digital signal in linear portions with sharp transitions to simplify the discussion herein. In one implementation, the clock signal CLK includes a residual noise level and may exhibit curves and smooth transitions rather than the linear portions with sharp transitions.

Figure 9:
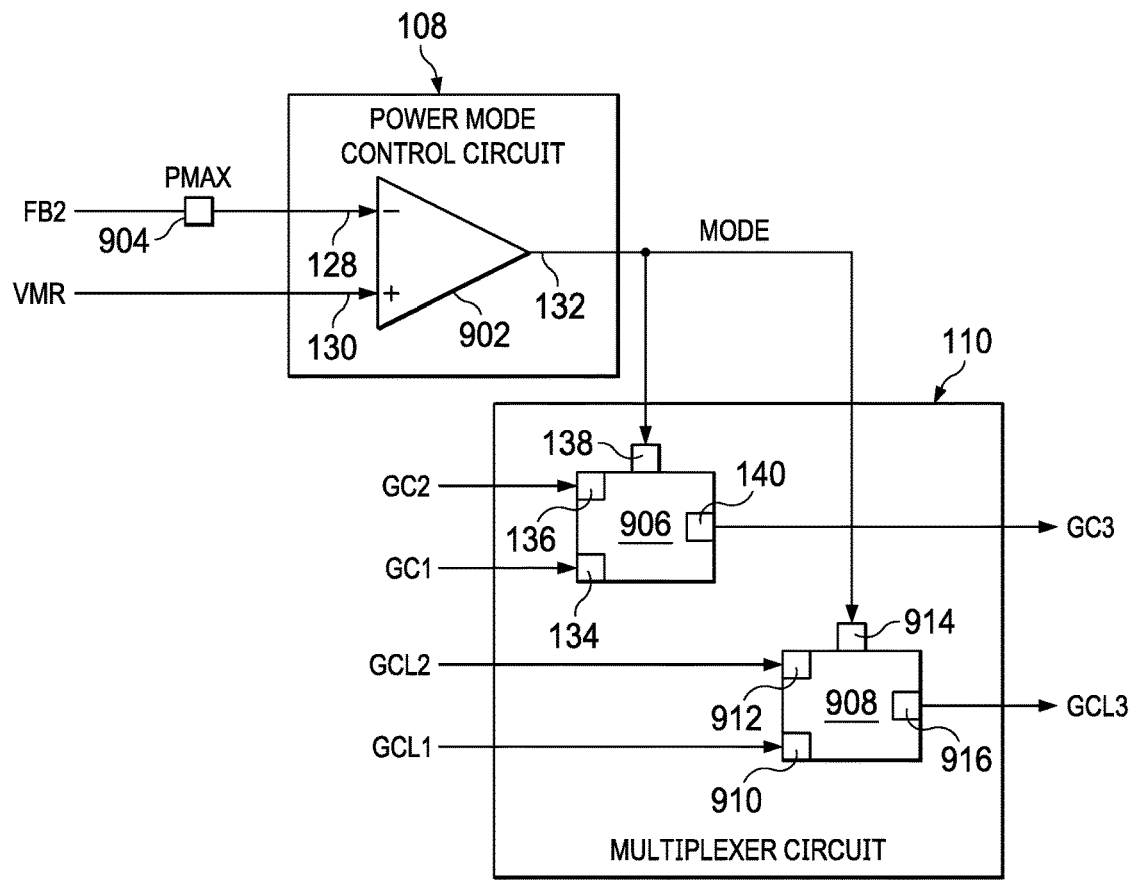
FIG. 9 is a schematic diagram of examples of a power mode control circuit and a multiplexer circuit.

FIG. 9 shows an example of the power mode control circuit 108, which includes a comparator circuit 902. The comparator circuit 902 includes the second output voltage feedback input 128, the mode reference input 130, and the mode selection output 132. The comparator circuit 902 receives the second feedback signal FB2 and the mode reference signal VMR. The comparator circuit 902 generates the mode selection signal MODE such that the mode selection signal MODE is set to a first condition (e.g., HARVEST) associated with routing the first gate control signal GC1 to the third gate control signal GC3 in response to the second feedback signal FB2 being less than the mode reference signal VMR. Otherwise, the comparator circuit 902 sets the mode selection signal MODE to a second condition (e.g., LIMIT) associated with routing the second gate control signal GC2 to the third gate control signal GC3. The comparator circuit 902 provides the mode selection signal MODE to the multiplexer circuit 110. In one example, the second feedback signal FB2 is provided to the comparator circuit 902 from the voltage divider circuit 152 (e.g., FIG. 1) via a terminal 904.

FIG. 9 shows an example of the multiplexer circuit 110 includes a switching device 906. The switching device 906 includes the first gate control input 134 (first input terminal), the second gate control input 136 (second input terminal), the mode selection input 138 (control terminal), and the third gate control output 140 (output terminal). The first input terminal (first gate control input 134) receives the first gate control signal GC1 from the power harvest controller circuit 104 (e.g., FIG. 1). The second input terminal (second gate control input 136) receives the second gate control signal GC2 from the voltage limit controller circuit 106 (e.g., FIG.

1). The control terminal (mode selection input 138) receives the mode selection signal MODE from the power mode control circuit 108. The third gate control output 140 provides the third gate control signal GC3 to the switching converter circuit 112 (e.g., FIG. 1). The switching device 906 connects the first input terminal to the output terminal and disconnects the second input terminal from the output terminal in response to a first condition (e.g., HARVEST) of the mode selection signal MODE. The switching device 906 connects the second input terminal to the output terminal and disconnects the first input terminal from the output terminal in response to a second condition (e.g., LIMIT) of the mode selection signal MODE.

In a further example of the multiplexer circuit 110, the first gate control signal GC1 includes the first gate control signal GC1 and a first low gate control signal, the second gate control signal includes the high side second gate control signal GC1 and the low side second gate control signal GCL2, and the third gate control signal includes a high side third gate control signal GC3 and a low side third gate control signal GCL3. In this example, the multiplexer circuit 110 also includes a second switching device 908. The second switching device 908 includes a first input terminal 910, a second input terminal 912, a control terminal 914, and an output terminal 916. The first input terminal 910 receives the first low gate control signal from the power harvest controller circuit 104 (e.g., FIG. 5). The second input terminal 912 receives the second low gate control signal from the voltage limit controller circuit 106 (e.g., FIG. 7). The control terminal 914 receives the mode selection signal MODE from the power mode control circuit 108. The output terminal 916 provides the third low gate control signal to the switching converter circuit 112 (e.g., FIG. 11). The second switching device 908 connects the first input terminal 910 to the output terminal 916 and disconnects the second input terminal 912 from the output terminal 916 in response to a first condition (e.g., HARVEST) of the mode selection signal MODE. The second switching device 908 connects the second input terminal 912 to the output terminal 916 and disconnects the first input terminal 910 from the output terminal 916 in response to a second condition (e.g., LIMIT) of the mode selection signal MODE.

Figure 10:
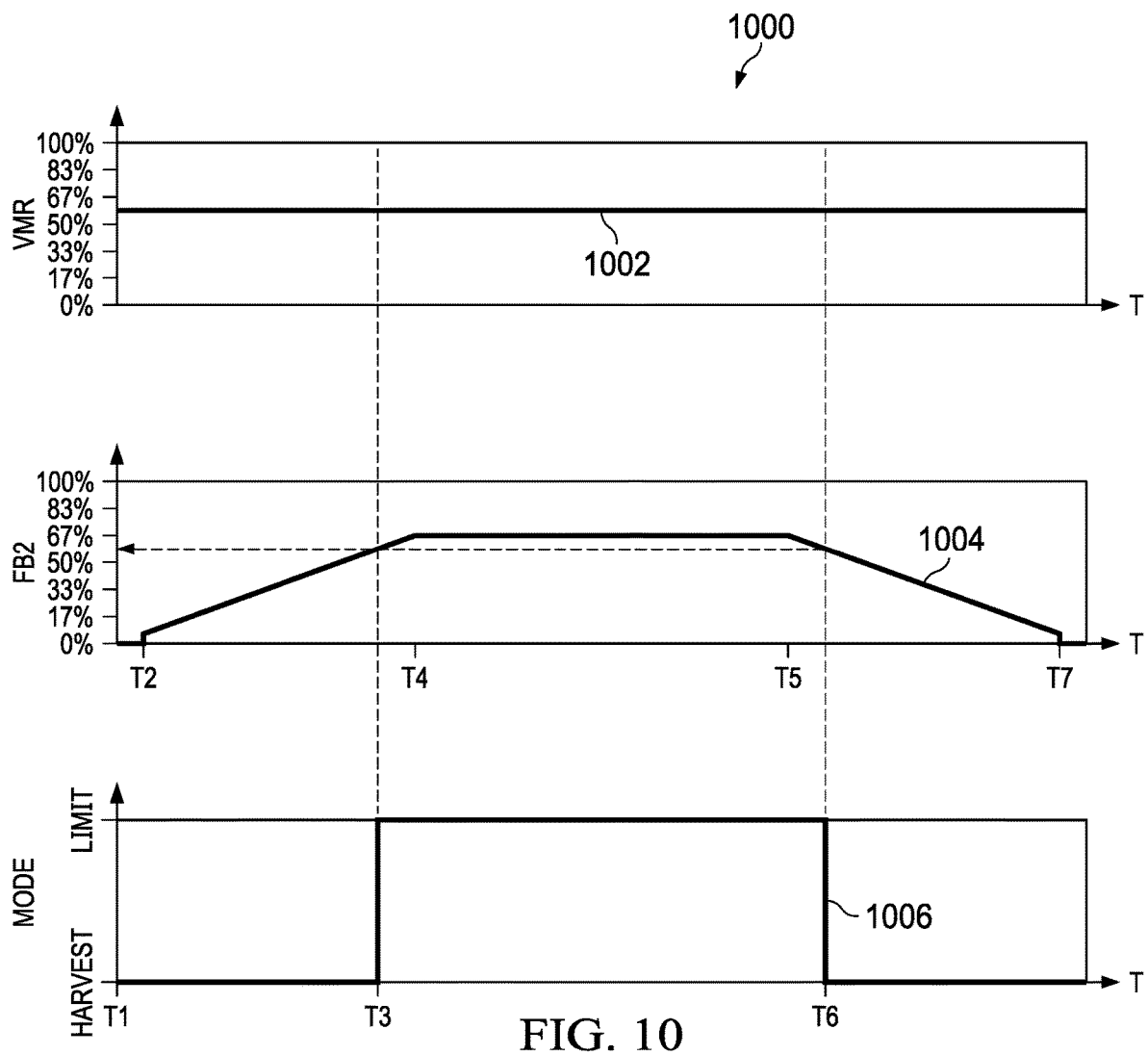
FIG. 10 is a timing diagram of an example of the timing of select signals shown in FIG. 9.

FIG. 10 shows a timing diagram 1000 of an example of the timing of select signals shown in FIG. 9 in relation to operation of the power mode control circuit 108 (e.g., FIG. 1) over the sunrise-to-sunset scenario discussed above in the description of FIG. 2.

A curve 1002 shows an example of the mode reference signal VMR provided to the comparator circuit 902 of the power mode control circuit 108. The mode reference signal VMR is an analog signal that reflects a predetermined mode switching threshold for the second feedback signal FB2 that is used to switch between power harvest and voltage limit modes. In this example, the mode reference signal VMR shows that the mode switching threshold is adjusted to 58.5 percent. The mode reference signal VMR is shown as an analog signal in a linear segment in FIG. 10 to simplify the discussion. In one implementation, the mode reference signal VMR includes a residual noise level and may exhibit curves and smooth transitions rather that the linear segment. In other examples, the mode reference signal VMR may be adjusted to be higher or lower than 58.5 percent.

A curve 1004 shows an example of the second feedback signal FB2 provided by the voltage divider circuit 152 to the power mode control circuit 108. The second feedback signal FB2 is an analog signal received by the voltage divider circuit 152 from the switching converter circuit 112. In this example, the DC output voltage signal $V_{OUT}$ and the second feedback signal FB2 follow the sunrise-to-sunset scenario. At sunrise (T1), the DC output voltage signal $V_{OUT}$ and the second feedback signal FB2 begin at zero (0) percent. After remaining at zero (0) percent for a brief period (T2), the DC output voltage signal $V_{OUT}$ and the second feedback signal FB2 start increasing to 67 percent as exposure of the PV sub-module 100 to the sun increases (T4). The DC output voltage signal $V_{OUT}$ and the second feedback signal FB2 remain at 67 percent until a point in the afternoon at which the exposure of the PV sub-module 100 to the sun is reduced (T5). The reduced exposure to the sun causes the DC output voltage signal $V_{OUT}$ and the second feedback signal FB2 to decrease from 67 percent to zero (0) percent at sunset (T7). The second feedback signal FB2 is shown as an analog signal in linear portions with sharp transitions to simplify the discussion herein. In one implementation, the second feedback signal FB2 includes a residual noise level and may exhibit curves and smooth transitions rather than the linear portions with sharp transitions. Additionally, the amplitude of the second feedback signal FB2 can vary over time due to numerous factors (e.g., rain, clouds, etc.). In this example, the second feedback signal FB2 ranges from zero (0) to 67 percent. In other examples, the range can be different. For example, the 67 percent voltage may be higher or lower.

A curve 1006 shows an example of the mode selection signal MODE generated by the power mode control circuit 108 of the controller circuit 102. The mode selection signal MODE is provided to the multiplexer circuit 104. The mode selection signal MODE is a digital signal that varies between "HARVEST" and "LIMIT" conditions. The power mode control circuit 108 switches the mode selection signal MODE between the "HARVEST" and "LIMIT" conditions based on the DC output voltage signal $V_{OUT}$ provided at the DC voltage output 146 of the switching converter circuit 112. At sunrise (T1), the mode selection signal MODE starts in the "HARVEST" condition. As midday approaches (T3), the power mode control circuit 108 switches the mode selection signal MODE from the "HARVEST" condition to the "LIMIT" condition based on the second feedback signal FB2 exceeding the mode reference signal VMR. After midday (T6), the power mode control circuit 108 switches the mode selection signal MODE from the "LIMIT" condition to the "HARVEST" condition based on the second feedback signal FB2 becoming less than the mode reference signal VMR. The mode selection signal MODE remains in the "HARVEST" condition until the DC output voltage signal $V_{OUT}$ exceeds the pre-determined threshold (e.g., 58.5 percent). The curve 1006 shows the mode selection signal MODE as a digital signal in linear portions with sharp transitions to simplify the discussion herein. In one implementation, the mode selection signal MODE includes a residual noise level and may exhibit curves and smooth transitions rather than the linear portions with sharp transitions. In this example, a mode switching threshold at which the power mode control circuit 108 switches between the "HARVEST" and "LIMIT" conditions is based on the mode reference signal VMR being set to 58.5 percent. In other examples, the mode switching threshold may be set higher or lower than 58.5 percent. Furthermore, the power mode control circuit 108 may implement a hysteresis associated with the mode switching threshold (e.g., 58.5 percent) that establishes a rising threshold (e.g., 59 percent) and a falling threshold (e.g., 58 percent) to avoid chatter in switching between the "HARVEST" and "LIMIT" conditions.

Figure 11:
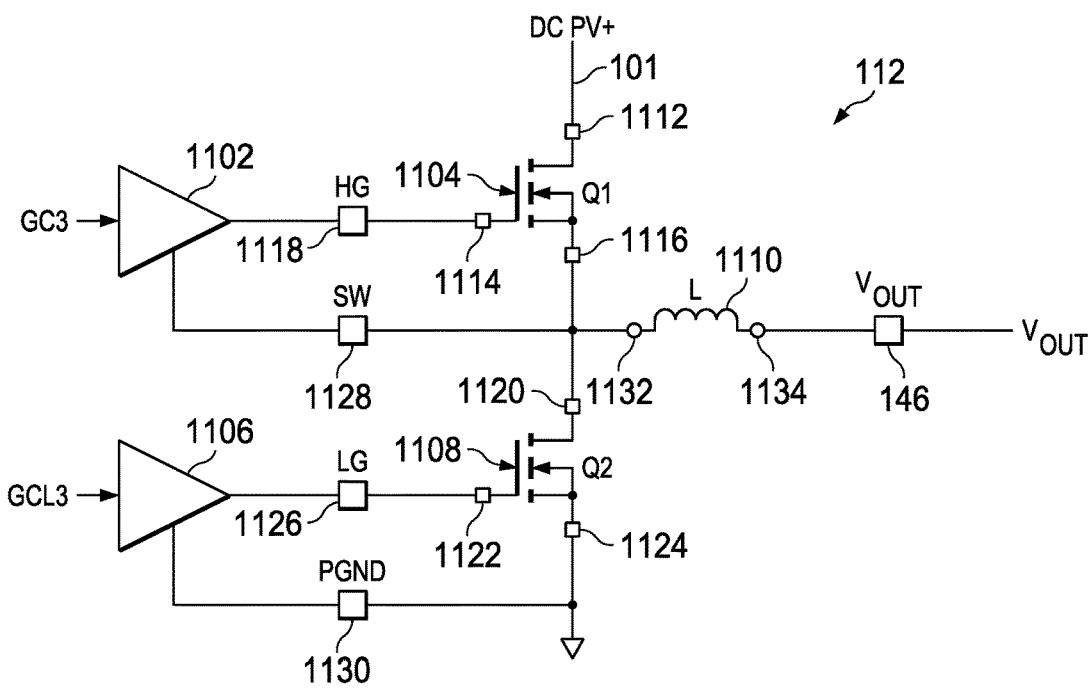
FIG. 11 is a schematic diagram of an example of a switching converter circuit.

FIG. 11 shows an example of the switching converter circuit 112, which includes a first driver circuit 1102, a first switching device 1104, a second driver circuit 1106, a second switching device 1108, and an inductor 1110. In this example (e.g., FIG. 1), the third gate control signal includes the high side third gate control signal GC3 and the low side third low gate control signal GCL3. The multiplexer circuit 110 (e.g., FIG. 9) provides the third gate control signals GC3 and GCL3 to the switching converter circuit 112. The first driver circuit 1102 receives the third gate control signal GC3 from the multiplexer circuit 110. The first driver circuit 1102 generates a high gate signal based on the low side third gate control signal GC3. The first switching device 1104 includes an input terminal 1112, a control terminal 1114, and an output terminal 1116. The input terminal 1112 receives the first DC string voltage signal DC PV+ from the string of PV cells 148 (e.g., FIG. 1). The control terminal 1114 receives the high gate signal from the first driver circuit 1102. The first switching device 1102 connects and disconnects the input terminal 1112 to and from the output terminal 1116 in response to pulses on the high gate signal. In one example, the first driver circuit 1102 provides a high gate signal HG to the control terminal 1114 of the first switching device 1104 via a high side gate pin 1118.

The second driver circuit 1106 receives the low side third gate control signal GCL3 from the multiplexer circuit 110 (e.g., FIG. 9). The second driver circuit 1106 generates a low side gate signal based on the low side third gate control signal GCL3. The second switching device 1108 includes an input terminal 1120, a control terminal 1122, and an output terminal 1124. The input terminal 1120 is coupled to the output terminal 1116 of the first switching device 1104. The control terminal 1122 receives the low side gate control signal LG from the second driver circuit 1106. The second switching device 1108 connects and disconnects the input terminal 1120 to and from the output terminal 1124 in response to pulses on the low gate control signal LG. In one example, the low gate signal is received from the second driver circuit 1106 by the control terminal 1122 of the second switching device 1108 via a low side gate terminal 1126. In another example, the output terminal 1116 of the first switching device 1104 and the input terminal 1120 of the second switching device 1108 are coupled to a switching node terminal 1128 with a switch node voltage signal SW. In another example, the output terminal 1124 of the second switching device 1108 is coupled to a ground terminal 1130 that is configured to be coupled to a power ground or other reference voltage signal PGND.

The inductor 1110 includes a first terminal 1132 and a second terminal 1134. The first terminal 1132 is coupled to the output terminal 1116 of the first switching device 1104 and the input terminal 1120 of the second switching device 1108. The second terminal 1134 is coupled to a DC PWR+ power line of a PV system associated with the PV sub-module 100 (e.g., FIG. 1). The inductor 1110 conducts current from the first switching device 1104 to the DC PWR+ power line after the first switching device 1104 is closed and the second switching device 1108 is open. The inductor 1110 conducts current from the DC PWR+ power line to the second switching device 1108 after the first switching device 1104 is open and the second switching device 1108 is closed. In one example, the first terminal 1132 of the inductor 1110 is coupled to the switching node terminal 1128. In another example, the second terminal 1124 of the inductor 1110 is coupled to the DC voltage output 146.

In another example, the first and second switching devices 1104, 1108 and the inductor 1110 of the switching converter circuit 112 are included in at least one of a buck converter, a boost converter, a buck-boost converter, or a Cuk converter.

FIG. 11 shows another example of the switching converter circuit 112, in which the second driver circuit 1106 receives the low side third gate control signal GCL3 from the multiplexer circuit 110. The second driver circuit 1106 inverts the low side third gate control signal GCL3 to form an inverted gate control signal. The second switching device 1108 includes an input terminal 1120, a control terminal 1122, and an output terminal 1124. The input terminal 1120 is coupled to the output terminal 1116 of the first switching device 1104. The control terminal 1122 receives the low gate signal from the second driver circuit 1106. The second switching device 1108 connects and disconnects the input terminal 1120 to and from the output terminal 1124 in response to pulses on the low gate signal.

Figure 12:
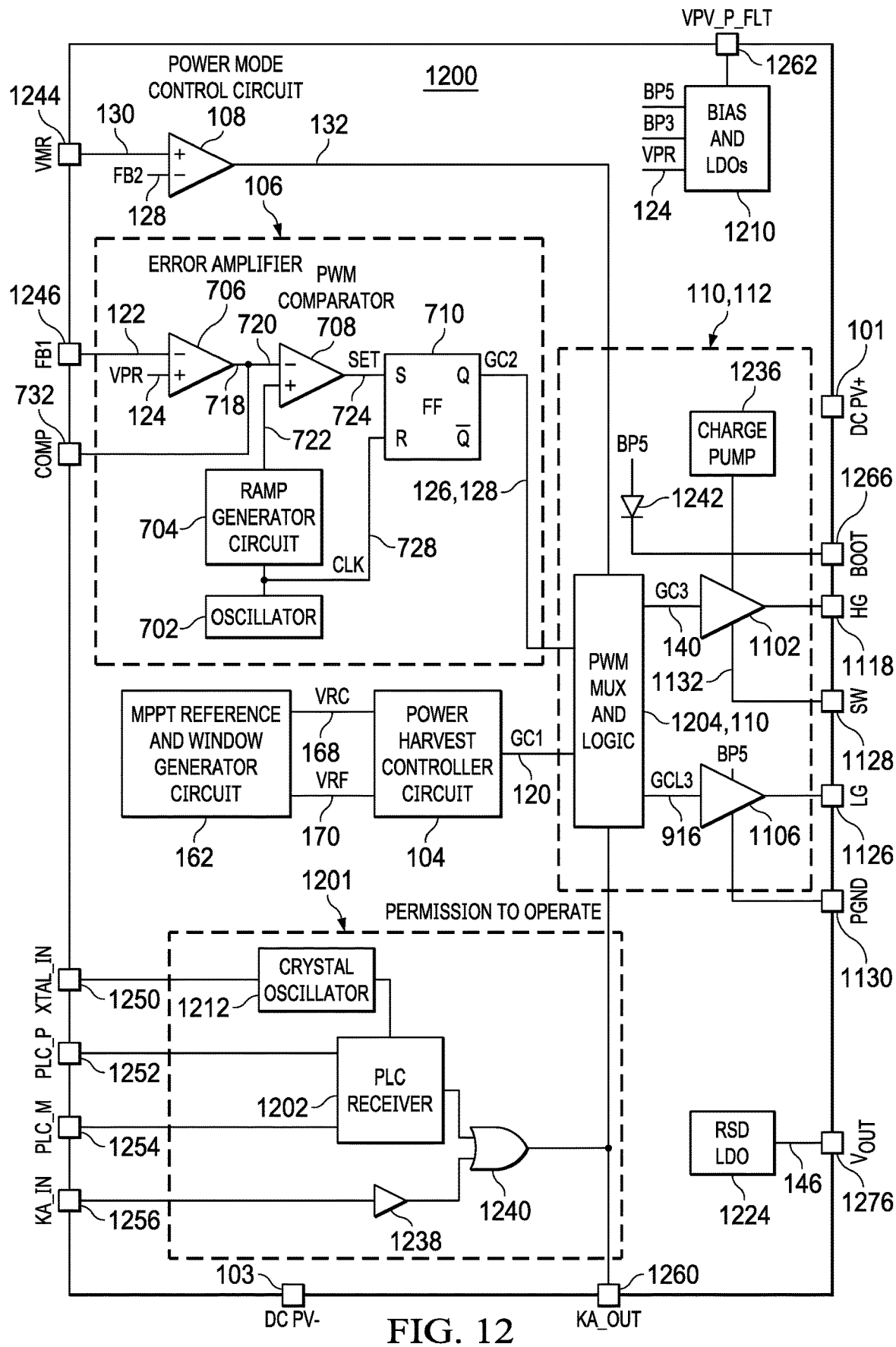
FIG. 12 is a schematic diagram of an example of an integrated circuit (IC) that facilitates control of a PV sub-module.

FIG. 12 shows an example of an IC 1200 that controls, and facilitates rapid shutdown of, a PV sub-module 100 (e.g., FIG. 1). The IC 1200 in one example is a power conversion controller with an integrated power-line communication (PLC) receiver that is designed for use within the junction box of a PV module. In this example, the IC 1200 includes a rapid shutdown circuit 1201 with a PLC receiver 1202, a crystal oscillator 1212 to support operation of the PLC receiver 1202, a buffer 1238 and an AND gate 1240. The IC 1200 includes the power harvest controller circuit 104, the voltage limit controller circuit 106, and the power mode control circuit 108 (e.g., FIG. 1 above). The IC 1200 also includes an output circuit, labeled 110, 112 that includes the above-described multiplexer circuit 110 and portions of the switching converter circuit 112 of FIG. 1. The output circuit 110, 112 in the IC 1200 of FIG. 12 includes a PWM mux and logic circuit (labeled 1204, 110 in FIG. 12). The PWM mux and logic circuit 1204, 110 includes the multiplexer circuit 110 described above. The IC 1200 also includes the first driver circuit 1102 (e.g., the high side driver as described above in connection with FIG. 11), the second driver circuit 1106 (e.g., a low side driver as in FIG. 11), and a bias and LDO circuit 1210 that provides a 5 V bias voltage signal BPS, a 3 V bias voltage signal BP3, and a reference voltage signal $V_{ref}$. The IC 1200 has an integrated boot regulator (not shown) and can operate with an externally connected ceramic capacitor between the boot terminal 1266 and the switch node terminal 1128 to provide the gate drive voltage for the high side MOSFET of the buck converter circuit 112. The bias and LDO circuit 1210 produces a precise ±1% voltage reference over temperature by scaling the output of a temperature-stable bandgap circuit, and the bias and LDO circuit 1210 in one example provides a 1.20 V PWM reference signal VPR at the non-inverting input 124 of the error amplifier circuit 706.

The IC 1200 also includes the voltage limiter control circuit 106 with the error amplifier circuit 706, the oscillator circuit 702 (e.g., a 1-MHz oscillator), the ramp generator circuit 704, the comparator circuit 708 (e.g., labeled "PWM comparator" in FIG. 12), the SR flip flop circuit 710, an RSD low dropout (LDO) circuit 1224 coupled to the DC voltage output 146 via a terminal 1276 to receive the DC output voltage signal $V_{OUT}$, the MPPT reference and window generator circuit 162 (e.g., FIG. 1 above), and a charge pump 1236 to support operation of the PWM mux and logic circuit 1204, 110.

The IC 1200 also includes a buffer 1238, an OR gate 1240, and a diode 1242. The IC 1200 includes a terminal 1244 coupled to the mode reference input 130 to receive the mode reference signal VMR from an external source, such as a voltage divider (not shown). The IC 1200 also includes, a feedback terminal 1246 coupled to the first output voltage feedback input 122 and configured to receive the first feedback signal FB1, a terminal 732 to receive an external compensation signal COMP, a terminal 1250 configured to be coupled to an external crystal (not shown) to receive an external crystal signal XTAL_IN. A terminal 1252 is configured to receive a positive or plus PLC signal PLC_P, and a terminal 1254 is configured to receive a negative or minus signal PLC_M.

The rapid shutdown circuit 1201 receives and processes the PLC signals PLC_P and PLC_M to determine an operating state of the PV system and selectively enters a shutdown state accordingly. In one example, the rapid shutdown circuit 1201 monitors the PLC_P and PLC_M signals for receipt of a an FSK keep alive signal from an external device (e.g., a system controller, not shown). In another implementation, the rapid shutdown circuit 1201 monitors a keep alive input signal KA_IN received by a terminal 1256, and generates a corresponding Boolean keep alive output signal KA_OUT at a keep alive output terminal 1260. In this implementation, multiple ICs 1200 are individually associated with a corresponding PV string (e.g., 148 in FIG. 1) and a corresponding switching converter (e.g., boost converter circuit), and the keep alive output terminal 1260 of one IC 1200 is coupled to provide a keep alive output signal to the keep alive input terminal 1256 of the next IC 1200.

The example IC 1200 includes a terminal 101 configured to receive the DC PV+ from the associated PV string 148, and a terminal 103 configured to receive the DC PV− signal from the associated PV string 148 (e.g., FIG. 1). A terminal 1262 is configured to receive a filtered supply voltage signal VPV_P_FLT for positive PV connections, and a terminal 1266 is configured to receive a voltage signal Boot to supply power to the high side gate driver 1102. The IC 1200 also includes the high side gate terminal 1118 coupled to the high side transistor gate to receive the high side gate signal HG from the output of the high side driver 1102. The IC 1200 also includes the switching node terminal 1128 configured to be coupled to receive the switch node voltage signal SW at the switching node of the buck converter (e.g., coupled to the inductor 1110, the source of the high side first transistor Q1, the drain of the low side second transistor Q2, and the bottom rail of the driver 1102 in FIG. 11 above). The IC 1200 also includes the low side gate terminal 1126 with the low side gate control signal LG, as well as the ground terminal 1130.

The terminal 1244 couples the voltage mode reference signal VMR to the input 130 of the power mode control circuit 108. The terminal 1246 is configured to couple the first feedback signal FB1 to the input 122 of the error amplifier circuit 706. The terminal 732 couples to an output of the error amplifier circuit 706. The terminals 1252, 1254 are input terminals that couple to inputs of the PLC receiver 1202. The terminal 1256 is an input terminal that couples to an input of the buffer 1238. The terminals 101 and 103 in the IC example of FIG. 12 are input terminals for positive and negative PV connections (e.g., to the string of PV cells 148 in FIG. 1). The terminal 1260 is an output terminal that couples to an output of the OR gate 1240. The high side gate terminal 1118 is an output terminal that couples to an output of the high side gate driver 1102. The switch node terminal 1128 is an output terminal that couples to the output of the high side gate driver 1102 and provides a switching node for a buck converter. The low side gate terminal 1126 is an output terminal that provides the low side gate signal LG from the output of the low side gate driver 1106 to the gate of an external low side transistor Q2 (e.g., FIG. 11). The terminal 1274 is an input terminal that provides a ground or other reference voltage connection to the low side gate driver 1106. The terminal 1276 couples the DC output voltage signal $V_{OUT}$ from an external output terminal or node (e.g., 146 in FIG. 1) of a buck converter for internal monitoring/feedback circuits.

When the PLC receiver 1202 detects a system-generated keep alive signal (KA) on the DC power line via the terminals 1252, 1254, the IC 1200 implements a power conversion algorithm that maximizes the module energy harvest under the constraint that the output voltage is limited to a user-defined level at the terminal 1244. When the PV string current is less than the maximum power current the output voltage is regulated to the level of the mode reference signal VMR, enabling string stretching. When the PV string current is greater than or equal to the maximum power current PV string current, the controller algorithm maximizes output power, optimizing operation in partial shading conditions. When the PLC receiver does not detect the KA signal, the output voltage is regulated to 0.33 V which is a safe level compliant with the NEC code that simplifies installation when the cabling of multiple strings shares the same conduit.

The IC 1200 operates as a power conversion controller that adds functionality to a PV sub-module junction box. In one example, the IC 1200 is part of a remotely operated buck controller circuit card assembly in a PV sub-module junction box. The circuit card assembly replaces traditional bypass diodes in PV sub-modules deployed in rooftop PV arrays. Remote control is achieved via the on-board PLC receiver 1202. The PLC protocol is compliant with the standard developed through the SunSpec Alliance. The control algorithms for the IC 1200 are compliant with the NEC 690.12 requirements for rapid shutdown. In normal operation, the IC 1200 increases energy harvest under any sunlight and load condition.

When the PLC receiver 1202 determines the KA signal is not present in the PLC signal received via the terminals 1252, 1254, the IC 1200 couples a 0.33 v standby voltage to the DC power line and decouples a regulated operating voltage (e.g., DC output voltage signal $V_{OUT}$). Even when stacked several times, the standby voltage provides a safe NEC-compliant shutdown voltage to aid PV installers in larger rooftop systems where multiple PV strings are routed through a common conduit. When the PLC receiver 1202 determines the KA signal is present in the PLC signal received via the terminals 1252, 1254, the IC 1200 increases buck output power with the constraint that the output voltage does not exceed a user-defined voltage set by the terminal 1244. The maximum power tracking performance is sufficiently fast enough to not interfere with MPPT operation of power inverters coupled to the DC power lines downstream from the PV sub-module.

When the PV string current is below a module maximum power current, the IC 1200 regulates the buck output voltage to the level of the mode reference signal VMR (e.g., defined by an external resistor divider (not shown). As the PV string current increases, the DC string voltage (e.g., DC PV+ 101 to DC PV− 103) falls and the IC 1200 increases the buck duty cycle to maintain the VMR output voltage, reaching D=1 when the PV string current reaches the level where the DC string voltage drops to VMR. During this mode of operation, the buck converter operates with a fixed frequency, voltage mode control loop to regulate the output voltage, including the error amplifier circuit 706, the ramp generator circuit 704, and the comparator circuit 708. The error amplifier circuit 706 is compensated externally via the COMP signal from the terminal 732.

When the PV string current exceeds the maximum power current, the control algorithms for the IC 1200 reduce the buck duty cycle to increase output power harvest, regulating the maximum power voltage and the maximum power current at the DC string voltage (buck input). The IC 1200 continually searches for maximum power harvest, tracking changes in sunlight or load current conditions. During this mode of operation, the buck converter operates with a fixed frequency, window hysteretic control loop to regulate the DC string voltage to the regulated operating voltage (e.g., DC output voltage signal $V_{OUT}$).

A resistor divider with a resistor between output node 146 of the buck converter 112 and the node 1244, and another resistor coupled between the node 1244 and the terminal 103 sets the value of the voltage mode reference signal VMR at which the DC output voltage $V_{OUT}$ of the buck converter is limited. The power mode control circuit 108 compares the voltage signal VMR to the onboard voltage reference 1.20 v. If VMR is above this threshold, the converter operates in output limiting mode. If VMR is below this threshold, the converter operates in MPPT mode.

In relation to rapid shutdown and the PLC receiver 1202, the IC 1200 can accommodate PV modules of various sizes (e.g., PV modules with multiple sub-modules). It is not necessary to couple the PLC signal to each IC 1200 associated with a PV module. Instead, the terminals 1256 and 1260 can be interconnected to daisy chain multiple ICs 1200 such that a string of PV sub-modules within a PV module is turned on or off simultaneously.

In addition, the individual ICs 1200 provide respective mode control for the corresponding switching converters 112 to intelligently accommodate selective shading or unshaded lighting conditions of the associated PV string 148. In this manner, any shading of sunlight that occurs in any portion of the string is decoupled from control operation of other PV strings 148 within an overall system. The PWM mux and logic circuit 1204, 110 responds to a PTO signal from the PLC receiver 1202 or from the terminal 1256 in conjunction with the OR gate 1240. Likewise, the voltage on the terminal 1260 follows the state of either the PLC receiver 1202 or the KA_IN 1256 in conjunction with the OR gate 1240. The IC 1200 has an integrated undervoltage lockout (UVLO, not shown) circuit that monitors the voltage of the terminal 101. When the VPV_P signal voltage at the terminal 101 is below 5 v relative to the DC PV− signal at the terminal 103, the power stage is high Z and the IC 1200 does not convert power. When the DC PV+ signal at the terminal 101 crosses 8 volts, power conversion commences.

Figure 13:
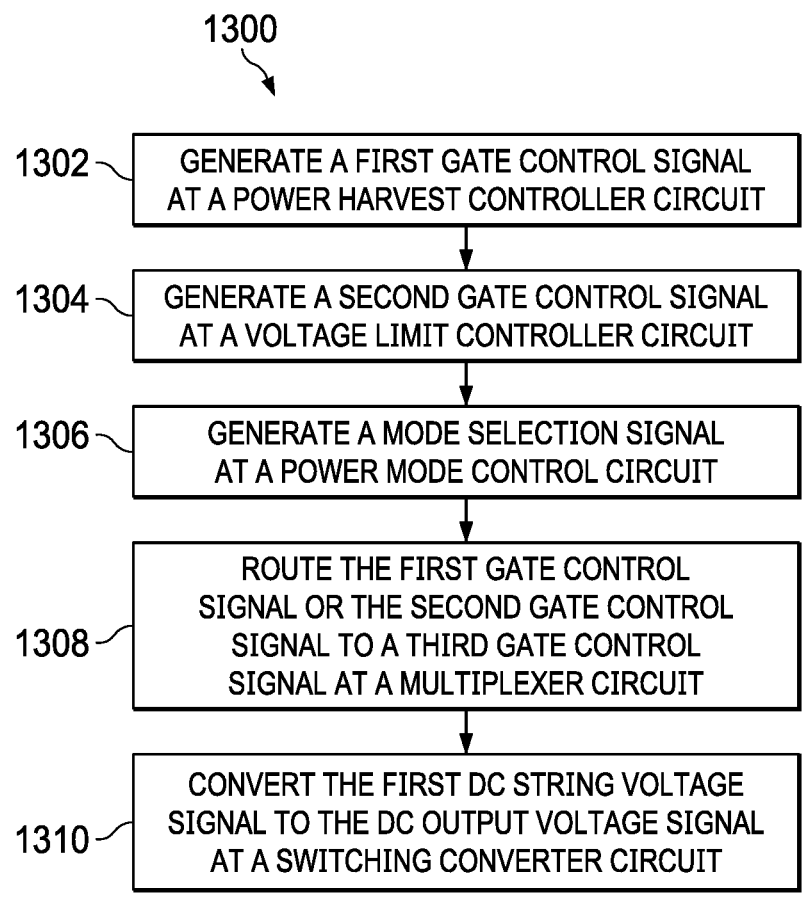
FIG. 13 is a flow chart for an example of a method for controlling a PV sub-module.

FIG. 13 shows an example of a method 1300 for controlling a PV sub-module 100 (e.g., FIG. 1). In several examples, the controller circuit 102 described in FIGS. 1-9 implements the method 1000. In FIG. 13, the method 1300 begins at 1302 with generating the first gate control signal GC1 at a first gate control output 120 of a power harvest controller circuit 104 based on the first DC string voltage signal DC PV+ from the string of PV cells 148 associated with the PV sub-module 100 at a first PV voltage input 114, the ceiling reference signal VRC that represents a ceiling threshold for the first DC string voltage signal DC PV+ at a ceiling reference input 116, and the floor reference signal VRF that represents a floor threshold for the first DC string voltage signal DC PV+ at a floor reference input 118. At 1304, the method also includes generating the second gate control signal GC2 at a second gate control output 126 of a voltage limit controller circuit 106 based on a first feedback signal FB1 that represents a DC output voltage signal $V_{OUT}$ associated with the PV sub-module 100 at a first output voltage feedback input 122 and the PWM reference signal VPR. At 1306, the mode selection signal MODE is generated at the mode selection output 132 of the power mode control circuit 108 based on the second feedback signal FB2 that represents the DC output voltage signal $V_{OUT}$ at a second output voltage feedback input 128 and the mode reference signal VMR at the mode reference input 130. At 1308, the method also includes routing the first gate control signal GC1 at a first gate control input 134 of a multiplexer circuit 110 or routing the second gate control signal GC2 at a second gate control input 136 to the third gate control signal GC3 at a third gate control output 140 in response to the mode selection signal MODE at a mode selection input 138. At 1310, the first DC string voltage signal DC PV+ at a second PV voltage input 142 of a switching converter circuit 112 is converted to the DC output voltage signal $V_{OUT}$ at a DC voltage output 146 in response to the third gate control signal GC3 at a third gate control input 144.

In another example, the method 1300 also includes adjusting the first gate control signal GC1 at the first gate control output 120 in response to changes in the first DC string voltage signal DC PV+ at the first PV voltage input 114 to harvest power from the PV sub-module 100.

In another example, the method 1300 also includes setting the mode selection signal MODE at the mode selection input 132 to a first condition (e.g., HARVEST) associated with routing the first gate control signal GC1 at the first gate control input 134 to the third gate control signal GC3 at the third gate control output 140 in response to the second feedback signal FB2 at the second output voltage feedback input 128 being less than the mode reference signal VMR at the mode reference input 130. Otherwise, the mode selection signal MODE is set to a second condition (e.g., LIMIT) associated with routing the second gate control signal GC2 at the second gate control input 136 to the third gate control signal GC3.

In another example, the method 1300 also includes providing the DC output voltage signal $V_{OUT}$ to a DC PWR+ power line of a PV system associated with the PV sub-module 100.

In another example of the method 1300, the first gate control signal GC1 includes a high side first gate control signal (e.g., GC1) and another (e.g., low side) first gate control signal (e.g., GCL1), the second gate control signal includes one (e.g., high side) second gate control signal GC2 and a low side second gate control signal GCL2, and the third gate control signal includes one (e.g., high side) third gate control signal GC3 and another (e.g., low side) third gate control signal GCL3. In this example, the method 1300 also includes generating the high side first gate control signal GC1 and the low side first gate control signal GCL1 at the power harvest controller circuit 104. The second gate control signals GC2 and GCL2 are generated at the voltage limit controller circuit 106. The high side first gate control signal GC1 from the power harvest controller circuit 104 or the high side second gate control signal GC2 from the voltage limit controller circuit 106 is routed to the one third gate control signal GC3 at the multiplexer circuit 110 in response to the mode selection signal MODE from the power mode control circuit 108. The low side first gate control signal GCL1 from the power harvest controller circuit 104 or the low side second gate control signal GCL2 from the voltage limit controller circuit is routed to the other third gate control signal GCL3 at the multiplexer circuit 110 in response to the mode selection signal MODE from the power mode control circuit 108. The first DC string voltage signal DC PV+ from the string of PV cells 148 is converted to the DC output voltage signal $V_{OUT}$ at the switching converter circuit 112 in response to the one third gate control signal GC3 and the other third gate control signal GCL3 from the multiplexer circuit 110.

Figure 14:
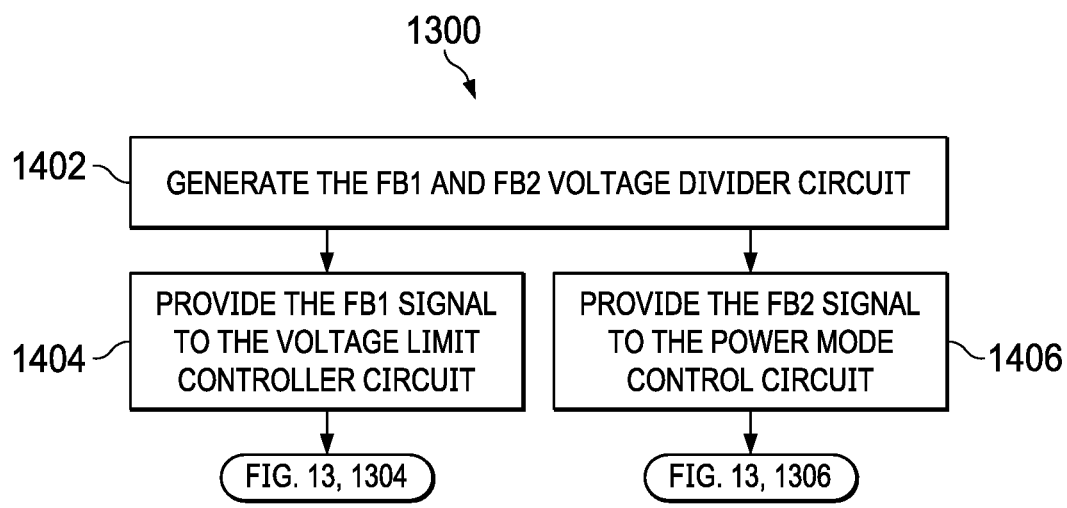
FIG. 14 is a flow chart for another example of a method for controlling a PV sub-module.

FIGS. 13 and 14 show another example of the method 1300, which also includes 1402 where the first feedback signal FB1 and the second feedback signal FB2s are generated at a voltage divider circuit 152 based on the DC output voltage signal $V_{OUT}$ from the switching converter circuit 112. At 1404, the first feedback signal FB1 is provided to the voltage limit controller circuit 106. From 1404, the method 1300 continues to 1304 of FIG. 13. At 1406, the second feedback signal FB2 is provided to the power mode control circuit 108. From 1406, the method 1300 continues to 1306 of FIG. 13.

In a further example, the method 1300 also includes generating a compensation signal COMP at the voltage limit controller circuit 106 based on a difference between the PWM reference signal VPR and the first feedback signal FB1. In this example, the first feedback signal FB1 is generated based on the compensation signal COMP from the voltage limit controller circuit 106.

Figure 15:
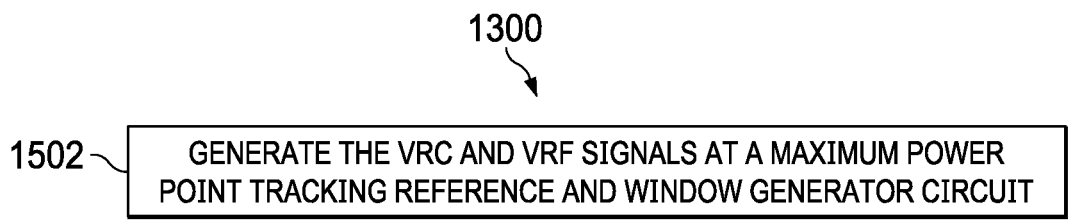
FIG. 15 is a flow chart for another example of a method for controlling a PV sub-module.

FIGS. 13 and 15 show another example of the method 1300, which also includes 1502 where the ceiling reference signal VRC and the floor reference signal VRF are generated at respective ceiling reference and floor reference outputs 168, 170 of an MPPT reference and window generator circuit 162 based on the DC output voltage signal $V_{OUT}$ at a second DC voltage input 166 and the first gate control signal GC1 at a first gate control input 164. From 1502, the method 1300 continues to 1302 of FIG. 13.

Figure 16:
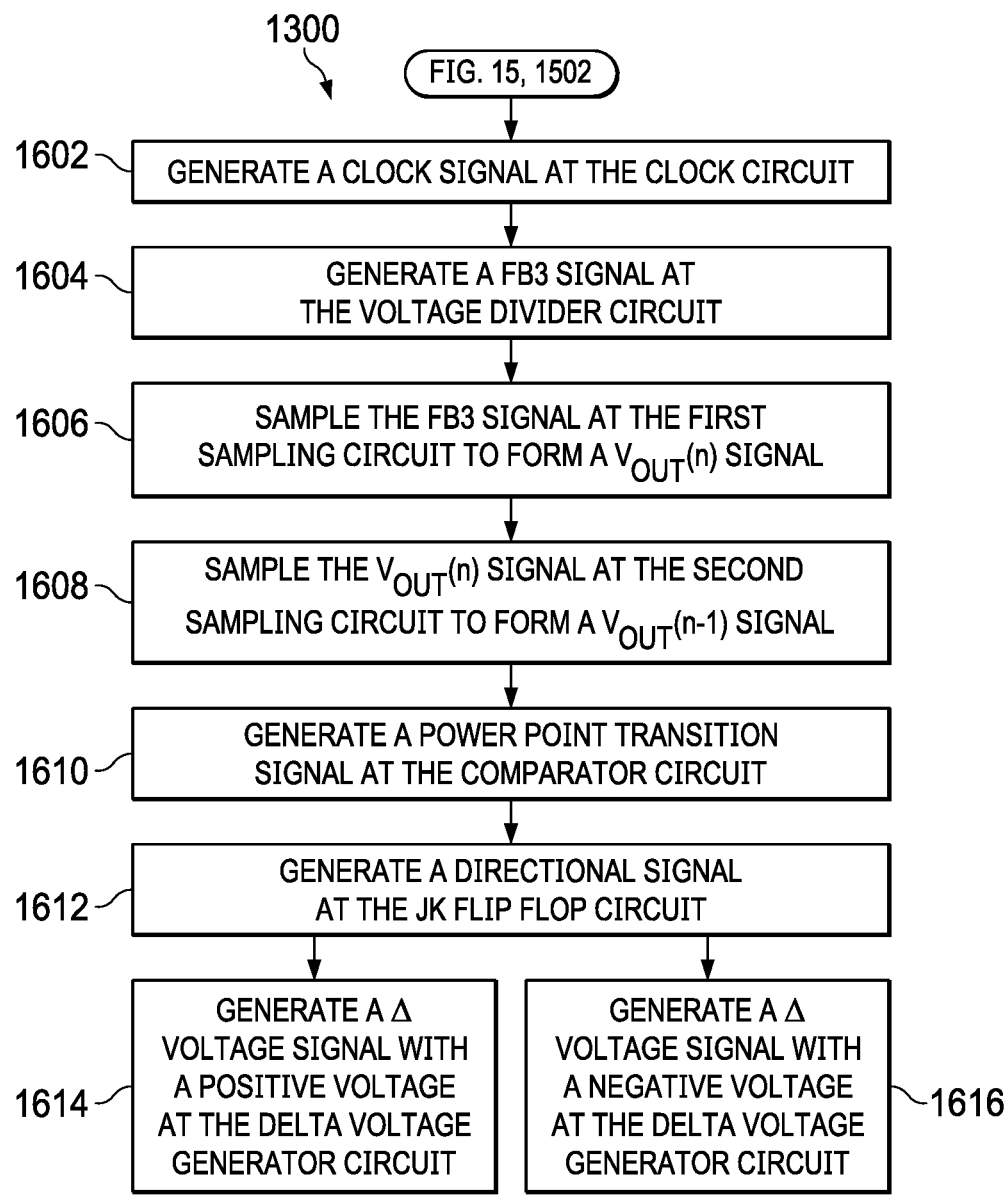
FIG. 16 is a flow chart for another example of a method for controlling a PV sub-module.

FIGS. 13, 15, and 16 show a further example of the method 1300, in which the MPPT reference and window generator circuit 162 (e.g., FIG. 1) includes a clock circuit 302 (e.g., FIG. 3), a voltage divider circuit 304, a first sampling circuit 306, a second sampling circuit 308, a comparator circuit 310, a JK flip flop circuit 312, and a delta voltage generator circuit 314. In this example, the method 1300 continues from 1502 of FIGS. 15 to 1602 where a first clock signal CLK1 is generated at a clock output 316 of the clock circuit 302. At 1604, the third feedback signal FB3 is generated at a third output voltage feedback output 318 of the voltage divider circuit 304 based on the DC output voltage signal $V_{OUT}$ at a second DC input 166. At 1606, the third feedback signal FB3 is sampled at a third output voltage feedback input terminal 320 of the first sampling circuit 306 to form a present output voltage sample signal $V_{OUT}(n)$. The present output voltage sample signal $V_{OUT}(n)$ is provided to a voltage sample output terminal 324 of the first sampling circuit 306 in response to rising or falling transitions of the first clock signal CLK1 at a first clock terminal 322. At 1608, the present output voltage sample signal $V_{OUT}(n)$ is sampled at a voltage sample input terminal 326 of the second sampling circuit 308 to form a previous output voltage sample signal $V_{OUT}(n-1)$. The previous output voltage sample signal $V_{OUT}(n-1)$ is provided to previous voltage sample output terminal 330 in response to rising or falling transitions of the first clock signal CLK1 at a second clock terminal 328. At 1610, the power point transition signal PWR PT TRANSITION is generated at a power point transition output 336 of the comparator circuit 310. The power point transition signal PWR PT TRANSITION having a first condition (e.g., NO CHANGE) indicating the present output voltage sample signal $V_{OUT}(n)$ at a first sample input 332 is greater than the previous output voltage sample signal $V_{OUT}(n-1)$ at a second sample input 334 and a second condition (e.g., TOGGLE) indicating the present output voltage sample signal $V_{OUT}(n)$ is less than the previous output voltage sample signal $V_{OUT}(n-1)$. At 1612, the direction signal DIRECTION is generated at a JK output terminal 342 of the JK flip flop circuit 312 in a first condition (e.g., INCREASE) in response to the first condition (e.g., NO CHANGE) of the power point transition signal PWR PT TRANSITION at J and K input terminals 338 and in a second condition (e.g., DECREASE) in response to the second condition (e.g., TOGGLE) of the power point transition signal PWR PT TRANSITION. At 1614, a voltage change signal Δ VOLTAGE with a positive voltage is generated at a delta voltage output 346 of the delta voltage generator circuit 314 in response to the first condition (e.g., INCREASE) of the direction signal DIRECTION at a direction input 344. At 1616, the voltage change signal Δ VOLTAGE with a negative voltage is generated in response to the second condition (e.g., DECREASE) of the direction signal DIRECTION.

In another further example, the method 1300 also includes applying hysteretic considerations at the comparator circuit 310 such that noise on the $V_{OUT}(n)$ and $V_{OUT}(n-1)$ signals does not result in chatter between the first and second conditions (e.g., NO CHANGE, TOGGLE) of the power point transition signal PWR PT TRANSITION.

In another further example of the method 1300, the MPPT reference and window generator circuit 162 also includes an integrator circuit 350, a PLL circuit 352, and a level shifting circuit 354. In this example, the method 1300 also includes generating the floor reference signal VRF at a floor reference output 170 of the integrator circuit 350 based on the voltage change signal Δ VOLTAGE at a delta voltage input 356 and the first clock signal CLK1 at a clock input 358. The integrator circuit 350 adds the positive voltage of the voltage change signal Δ VOLTAGE to a previous floor reference signal $V_{REF\ FLOOR}(n-1)$ in response to rising or falling transitions of the first clock signal CLK1 at the clock input 358 and subtracts the negative voltage of the voltage change signal Δ VOLTAGE from the previous floor reference signal $V_{REF\ FLOOR}(n-1)$ in response to rising or falling transitions of the first clock signal CLK1 to form the floor reference signal VRF. Next, the level adjust signal LVL ADJ is generated at a level adjust output 362 of the PLL circuit 352 in response to the first gate control signal GC1 at a first gate control input 164. The ceiling reference signal VRC is generated at a ceiling reference output 168 of the level shifting circuit 354 by shifting the floor reference signal VRF at a second floor reference input 364 based on the level adjust signal LVL ADJ at a level adjust input 366. In an even further example, the method 1300 also includes dynamically altering the shifting at the level shifting circuit 354 by changing the level adjust signal LVL ADJ at the PLL circuit 352 to adapt a window between the $V_{REF\ FLOOR}(n)$ and the ceiling reference signal VRC such that a desired pulse width for pulses on the first gate control signal GC1 is maintained over time.

In another example of the method 1300, the MPPT reference and window generator circuit 162 also includes an integrator circuit, a PLL circuit, and a second voltage divider circuit. In this example, the method 1300 also includes generating the ceiling reference signal VRC at the integrator circuit based on the voltage change signal Δ VOLTAGE and the first clock signal CLK1. The integrator circuit adds the positive voltage for the voltage change signal Δ VOLTAGE to a previous ceiling reference signal (e.g., VRC(n-1)) in response to rising or falling transitions of the and subtracts the negative voltage for the voltage change signal Δ VOLTAGE from the previous ceiling reference signal $V_{REF\ CEILING}(n-1)$ in response to rising or falling transitions of the first clock signal CLK1 to form the ceiling reference signal VRC. Next, a level adjust signal LVL ADJ is generated at the PLL circuit in response to the first gate control signal GC1. The floor reference signal VRF is generated at the second voltage divider circuit by attenuating the ceiling reference signal VRC based on the level adjust signal LVL ADJ. In an even further example, the method 1300 also includes dynamically altering the attenuating by changing the level adjust signal LVL ADJ to adapt a window between the $V_{REF\ FLOOR}(n)$ and ceiling reference signal VRC such that a desired pulse width for pulses on the first gate control signal GC1 is maintained over time.

Figure 17:
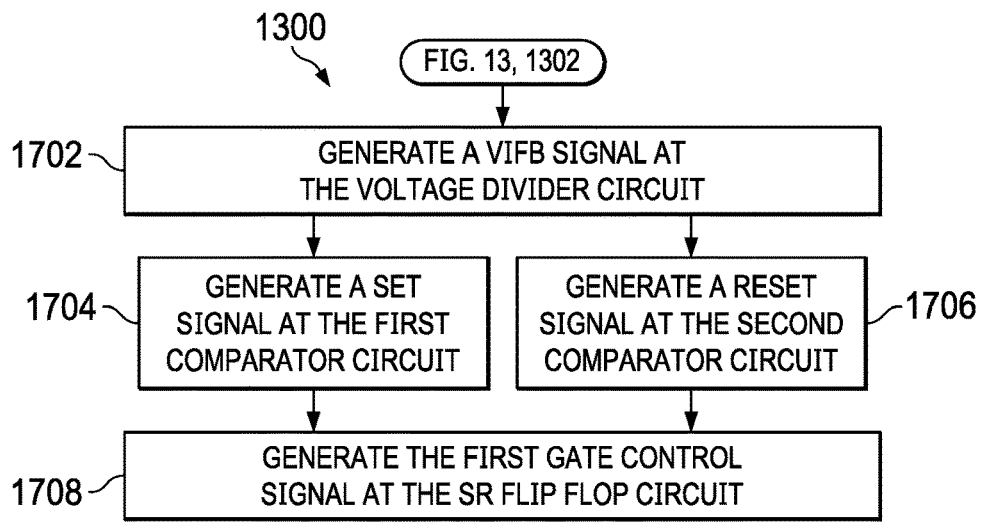
FIG. 17 is a flow chart for another example of a method for controlling a PV sub-module.

FIGS. 13 and 17 show another example of the method 1300, in which the power harvest controller circuit 104 (e.g., FIG. 1) includes a voltage divider circuit 502 (e.g., FIG. 5), a first comparator circuit 504, a second comparator circuit 506, and an SR flip flop circuit 508. In this example, the method 1300 continues from 1302 of FIGS. 13 to 1702 where a input voltage feedback signal VIFB is generated at an input voltage feedback output 510 of the voltage divider circuit 502 based on the first DC string voltage signal DC PV+ at a first PV voltage input 114. At 1704, a set signal SET is generated at a set output 514 of the first comparator circuit 504 based on the input voltage feedback signal VIFB at a first input voltage feedback input 512 and the ceiling reference signal VRC at a ceiling reference input 116. At 1706, the reset signal RESET is generated at a reset output 518 of the second comparator circuit 506 based on the input voltage feedback signal VIFB at a second input voltage feedback input 516 and the floor reference signal VRF at a floor reference input 118. At 1708, the first gate control signal GC1 is generating by setting an SR output terminal 120 of the SR flip flop circuit 508 to a first condition (e.g., 1) in response to the set signal SET at a set input terminal 520 and by setting the SR output terminal 120 to a second condition (e.g., 0) in response to the reset signal RESET at a reset input terminal 522.

In a further example of the method 1300, the first gate control signal GC1 includes the high side first gate control signal GC1 and a low side first gate control signal GCL1. In this example, the method 1300 also includes generating the first gate control signals GC1 and GCL1 by setting the SR output terminal 120 to the first condition (e.g., 1) and a second SR output terminal 526 to the second condition (e.g., 0) in response to the set signal SET and by setting the SR output terminal 120 to the second condition (e.g., 0) and the second SR output terminal 526 to the first condition (e.g., 1) in response to the reset signal RESET.

Figure 18:
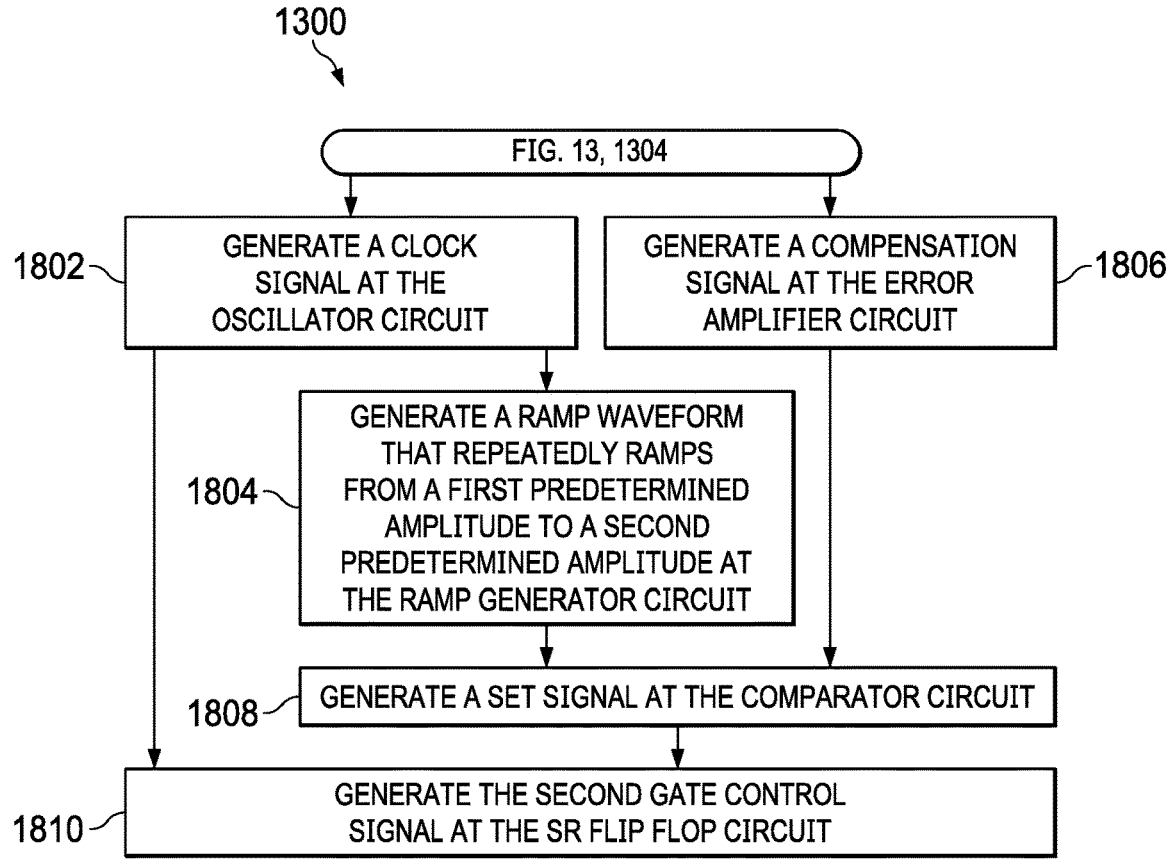
FIG. 18 is a flow chart for another example of a method for controlling a PV sub-module.

FIGS. 13 and 18 show another example of the method 1300, in which the voltage limit controller circuit 106 (e.g., FIG. 1) includes an oscillator circuit 702 (e.g., FIG. 7), a ramp generator circuit 704, an error amplifier circuit 706, a comparator circuit 708, and an SR flip flop circuit 710. In this example, the method 1300 continues from 1304 of FIGS. 13 to 1802 where the clock signal CLK is generated at a clock output 712 of the oscillator circuit 702. At 1804, a ramp signal RAMP that repeatedly ramps from a first predetermined amplitude (e.g., zero (0) percent) to a second predetermined amplitude (e.g., 102 percent) is generated at a waveform output 716 of the ramp generator circuit 704 based on the clock signal CLK at the clock input 714. The method 1300 also continues from 1304 of FIGS. 13 to 1806 where a compensation signal COMP is generated at a compensation output 718 of the error amplifier circuit 706 based on a difference between the PWM reference signal VPR at the pulse width reference input 124 and the first feedback signal FB1 at the first output voltage feedback input 122. At 1808, a set signal SET is generated at a set output 724 of the comparator circuit 708 based on the compensation signal COMP at a first input 720 and the ramp signal RAMP at a second input 722. At 1810, the second gate control signal GC2 is generated by setting an SR output terminal 126 of the SR flip flop circuit 710 to a first condition (e.g., 1) in response to the set signal SET at a set input terminal 726 and by setting the SR output terminal 126 to a second condition (e.g., 0) in response to the clock signal CLK at a reset input terminal 728.

In a further example of the method 1300, the second gate control signal includes the high side second gate control signal GC2 and the low side second gate control signal GCL2. In this example, the method 1300 also includes generating the second gate control and second low gate control signals by setting the SR output terminal 126 of the SR flip flop circuit 710 to the first condition (e.g., 1) and a second SR output terminal 734 to the second condition (e.g., 0) in response to the set signal SET at the set input terminal 726 and by setting the SR output terminal 126 to the second condition (e.g., 0) and the second SR output terminal 734 to the first condition (e.g., 1) in response to the clock signal CLK at the reset input terminal 728.

Figure 19:
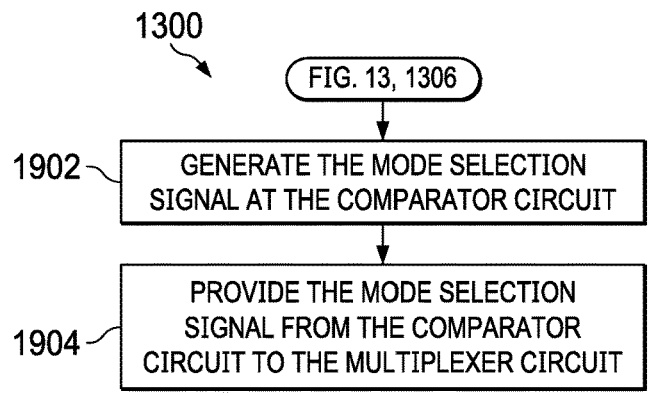
FIG. 19 is a flow chart for another example of a method for controlling a PV sub-module.

FIGS. 13 and 19 show another example of the method 1300, in which the power mode control circuit 108 (e.g., FIG. 1) includes a comparator circuit 902 (e.g., FIG. 9). In this example, the method 1300 continues from 1306 of FIGS. 13 to 1902 where the mode selection signal MODE is generated at a mode selection output 132 of the comparator circuit 902 such that the mode selection signal MODE is set to a first condition (e.g., HARVEST) associated with routing the first gate control signal GC1 at the first gate control input 134 to the third gate control signal GC3 at the third gate control output 140 in response to the second feedback signal FB2 at a second output voltage feedback input 128 being less than the mode reference signal VMR at the mode reference input 130. Otherwise, the mode selection signal MODE is set to a second condition (e.g., LIMIT) associated with routing the second gate control signal GC2 at the second gate control input 136 to the third gate control signal GC3. At 1904, the mode selection signal MODE is provided from the to the mode selection input 138 of the multiplexer circuit 110.

Figure 20:
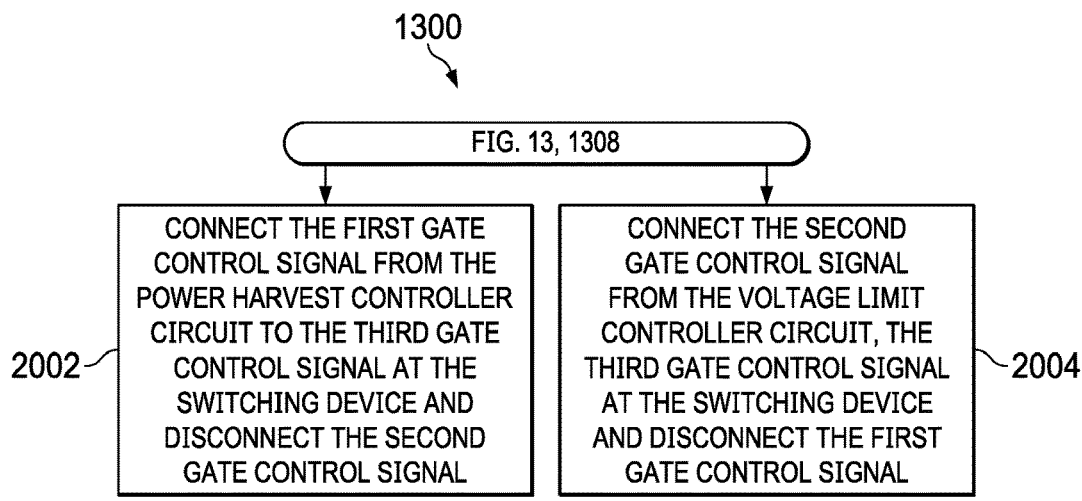
FIG. 20 is a flow chart for another example of a method for controlling a PV sub-module.

FIGS. 13 and 20 show another example of the method 1300, in which the multiplexer circuit 110 (e.g., FIG. 1) includes a switching device 906 (e.g., FIG. 9). In this example, the method 1300 continues from 1308 of FIGS. 13 to 2002 where the first gate control signal GC1 at a first gate control input 134 of the switching device 906 is coupled to the third gate control output 140 and the second gate control signal GC2 at a second gate control input 136 is disconnected from the third gate control output 140 in response to a first condition (e.g., HARVEST) of the mode selection signal MODE at a mode selection input 138. The method 1300 also continues from 1308 of FIGS. 13 to 2004 where the second gate control signal GC2 at the second gate control input 136 is coupled to the third gate control output 140 and the first gate control signal GC1 at the first gate control input 134 is disconnected from the third gate control output 140 in response to a second condition (e.g., LIMIT) of the mode selection signal MODE at the mode selection input 138.

In a further example of the method 1300, the multiplexer circuit 110 also includes a second switching device 908. In this example, the first gate control signal includes a high side first gate control signal GC1 and a low side first gate control signal GCL1, the second gate control signal includes the high side second gate control signal GC2 and the low side second gate control signal GCL2, and the third gate control signal includes the high side third gate control signal GC3 and the low side third low gate control signal GCL3. The method 1300 in this example also includes connecting the first low gate control signal at a first low gate control input 910 of the second switching device 908 to the third low gate control signal at a third low gate control output 916 and disconnecting the second low gate control signal at a second low gate control input 912 from the third low gate control output 916 in response to the first condition (e.g., HARVEST) of the mode selection signal MODE at the mode selection input 914. In this example, the second low gate control signal at the second low gate control input 912 is coupled to the third low gate control signal at the third low gate control output 916 and the first low gate control signal at the first low gate control input 910 is disconnected from the third low gate control output 916 in response to the second condition (e.g., LIMIT) of the mode selection signal MODE at the mode selection input 914.

Figure 21:
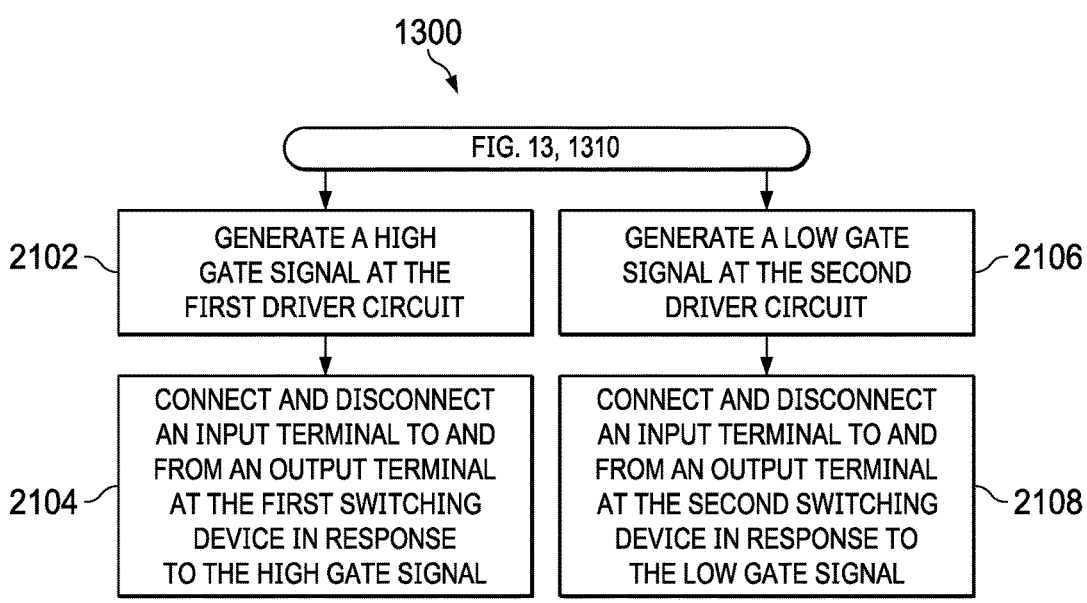
FIG. 21 is a flow chart for another example of a method for controlling a PV sub-module.

FIGS. 13 and 21 show another example of the method 1300, in which the switching converter circuit 112 (e.g., FIG. 1) includes a first driver circuit 1102 (e.g., FIG. 11), a first switching device 1104, a second driver circuit 1106, a second switching device 1108, and an inductor 1110. In this example, the third gate control signal includes the high side third gate control signal GC3 and the low side third low gate control signal GCL3. The method 1300 continues from 1310 of FIGS. 13 to 2102 in this example. At 2102, a high side gate signal HG is generated at the output of the first driver circuit 1102 based on the high side third gate control signal GC3 from the multiplexer circuit 110. At 2104, the first DC string voltage signal DC PV+ from the string of PV cells 148 at an input terminal 1112 of the first switching device 1104 is connected to and disconnected from an output terminal 1116 in response to pulses on the high gate signal at a control terminal 1114. The method 1300 also continues from 1310 of FIGS. 13 to 2106 in this example. At 2106, a low gate signal is generated at the second driver circuit 1106 based on the third low gate control signal from the multiplexer circuit 110. At 2108, an input terminal 1120 of the second switching device 1108 is connected to and disconnected from an output terminal 1124 in response to pulses on the low gate signal at a control terminal 1122. The input terminal 1120 of the second switching device 1108 is coupled to the output terminal 1116 of the first switching device 1104. The inductor 1110 includes a first terminal 1132 and a second terminal 1134. The first terminal 1132 is coupled to the output terminal 1116 of the first switching device 1104 and the input terminal 1120 of the second switching device 1108. The second terminal 1134 is coupled to a DC PWR+ power line of a PV system associated with the PV sub-module 100. The inductor 1110 conducts current from the first switching device 1104 to the DC PWR+ power line after the first switching device 1104 is closed and the second switching device 1108 is open. The inductor 1110 conducts current from the DC PWR+ power line to the second switching device 1108 after the first switching device 1104 is open and the second switching device 1108 is closed.

In another example of the method 1300, the switching converter circuit 112 (e.g., FIG. 1) includes a first driver circuit 1102 (e.g., FIG. 11), a first switching device 1104, a second driver circuit 1106, a second switching device 1108, and an inductor 1110. In this example, the method 1300 also includes generating a high side gate signal HG at the first driver circuit 1102 based on the third gate control signal GC3 from the multiplexer circuit 110. The first DC string voltage signal DC PV+ from the string of PV cells 148 at an input terminal 1112 of the first switching device 1104 is connected to and disconnected from an output terminal 1116 of the first switching device 1104 in response to pulses on the high gate signal at a control terminal 1114. The low side third gate control signal GCL3 from the multiplexer circuit 110 is inverted at the second driver circuit 1106 to form an inverted low side gate control signal LG at the output of the second driver circuit 1106. An input terminal 1120 of the second switching device 1108 is connected to and disconnected from the output terminal 1124 of the second switching device 1108 in response to pulses on the low gate signal at a control terminal 1122. The input terminal 1120 of the second switching device 1108 is coupled to the output terminal 1116 of the first switching device 1104. The inductor 1110 includes a first terminal 1132 and a second terminal 1134. The first terminal 1132 is coupled to the output terminal 1116 of the first switching device 1104 and the input terminal 1120 of the second switching device 1108. The second terminal 1134 is coupled to a DC PWR+ power line of a PV system associated with the PV sub-module 100. The inductor 1110 conducts current from the first switching device 1104 to the DC PWR+ power line after the first switching device 1104 is closed and the second switching device 1108 is open. The inductor 1110 conducts current from the DC PWR+ power line to the second switching device 1108 after the first switching device 1104 is open and the second switching device 1108 is closed.

Figure 22:
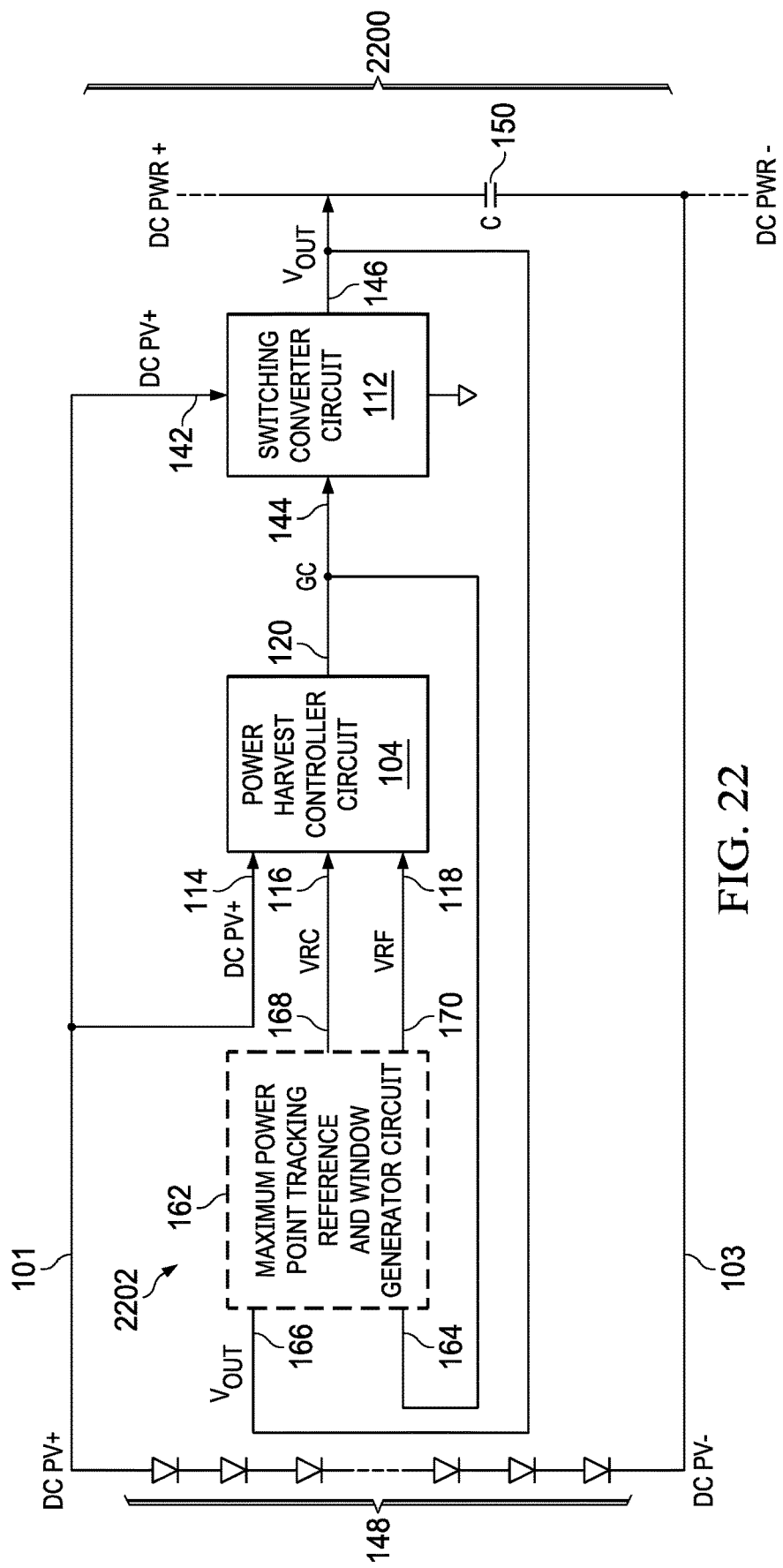
FIG. 22 is a schematic diagram of another example of a controller circuit for a PV sub-module.

FIG. 22 shows another example controller circuit 2202 for a PV sub-module 2200. The controller circuit 2202 includes the MPPT reference and window generator circuit 162, the power harvest controller circuit 104, and the switching converter circuit 112. The MPPT reference and window generator circuit 162 includes the DC voltage input 166, the first gate control input 164, the ceiling reference output 168, and the floor reference output 170. The power harvest controller circuit 104 includes the first PV voltage input 148, the ceiling reference input 116 coupled to the ceiling reference output 168, the floor reference input 118 coupled to the floor reference output 170, and the gate control output 120 coupled to the first gate control input 164. The switching converter circuit 112 includes the second PV voltage input 142, the second gate control input 144 coupled to the gate control output 120, the DC voltage output 146, and the switching converter circuit 112 coupled between the second PV voltage input 142 and the DC voltage output 146. The switching converter circuit 112 includes a switch with a control terminal coupled to the second gate control input 144.

The MPPT reference and window generator circuit 162 receives the DC output voltage signal $V_{OUT}$ associated with the PV sub-module 2200. The MPPT reference and window generator circuit 162 receives a gate control signal GC. The MPPT reference and window generator circuit 162 generates the ceiling reference signal VRC that represents the ceiling threshold for the first DC string voltage signal DC PV+ from the string of PV cells 148 associated with the PV sub-module 2200 based on the DC output voltage signal $V_{OUT}$ and the gate control signal. The MPPT reference and window generator circuit 162 generates the floor reference signal VRF that represents the floor threshold for the first DC string voltage signal DC PV+ based on the DC output voltage signal $V_{OUT}$. The power harvest controller circuit 104 receives the first DC string voltage signal DC PV+ from the string of PV cells 148. The power harvest controller circuit 104 generates the gate control signal based on the first DC string voltage signal DC PV+ and the ceiling reference signal VRC and the floor reference signal VRF. The power harvest controller circuit 104 provides the gate control signal to the MPPT reference and window generator circuit 162. The switching converter circuit 112 receives the first DC string voltage signal DC PV+ from the string of PV cells 148. The switching converter circuit 112 receives the gate control signal from the power harvest controller circuit 104. The switching converter circuit 112 converts the first DC string voltage signal DC PV+ to the DC output voltage signal $V_{OUT}$ in response to the gate control signal.

In another example, the PV sub-module 2200 includes the controller circuit 2202. In another example, the MPPT reference and window generator circuit 162 and power harvest controller circuit 104 are included in an IC. In a further example, at least a portion of the switching converter circuit 112 is included in the IC. In another example, the power harvest controller circuit 104 adjusts the gate control signal in response to changes in the first DC string voltage signal DC PV+ at the first PV voltage input 114 to harvest power from the PV sub-module 2200. In another example, the switching converter circuit 112 provides the DC output voltage signal $V_{OUT}$ at the DC voltage output 146 with a signal DC PWR+ of a PV system associated with the PV sub-module 2200. In this example, a capacitor 150 is coupled between the DC voltage output 146 and a negative DC power line 103.

In another example, the gate control signal GC includes one gate control signal (e.g., the high side gate control signal GC1 described above) and another (e.g., low side) gate control signal (e.g., GCL1). In this example, the power harvest controller circuit 104 generates the gate control signals GC1 and GCL1. The switching converter circuit 112 receives the gate control signals GC1 and GCL1 from the power harvest controller circuit 104. The switching converter circuit 112 converts the first DC string voltage signal DC PV+ to the DC output voltage signal $V_{OUT}$ in response to the gate control signals GC1 and GCL1.

Figure 23:
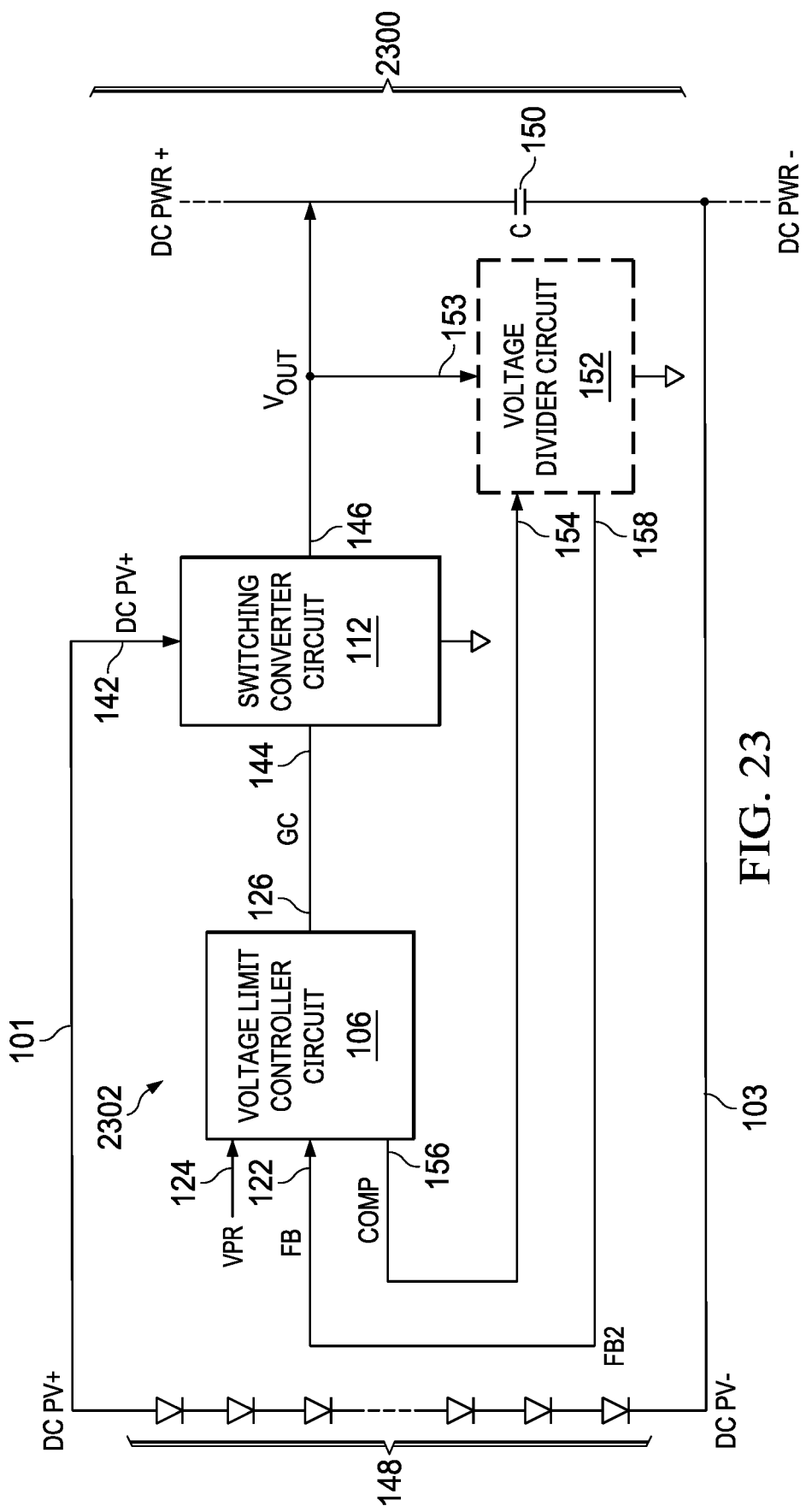
FIG. 23 is a schematic diagram of another example of a controller circuit for a PV sub-module.

FIG. 23 shows another example controller circuit 2302 for a PV sub-module 2300. The controller circuit 2302 includes the voltage limit controller circuit 106 and the switching converter circuit 112. The voltage limit controller circuit 106 includes the output voltage feedback input 122, the pulse width reference input 124, and the gate control output 126. The switching converter circuit 112 includes the PV voltage input 142, the gate control input 144 coupled to the gate control output 126, the DC voltage output 146, and a switch (not shown) coupled between the PV voltage input 142 and the DC voltage output 146, where the switch includes a control terminal coupled to the gate control input 144. The voltage limit controller circuit 106 generates a gate control signal GC based on a feedback signal FB that represents the DC output voltage signal $V_{OUT}$ associated with the PV sub-module 2300 and the PWM referenced signal VPR that represents a threshold for the DC output voltage signal $V_{OUT}$. The switching converter circuit 112 receives the first DC string voltage signal DC PV+ from a string of PV cells 148. The switching converter circuit 112 receives the gate control signal from the voltage limit controller circuit 106. The switching converter circuit 112 converts the first DC string voltage signal DC PV+ to the DC output voltage signal $V_{OUT}$ in response to the gate control signal.

In another example, the PV sub-module 2300 includes the controller circuit 2302. In another example, the voltage limit controller circuit 106 is included in an IC. In a further example, at least a portion of the switching converter circuit 112 is included in the IC. In another example, the threshold is indicative of a condition in which the DC output voltage signal $V_{OUT}$ is less than an open circuit voltage for the PV sub-module 2300. In another example, the switching converter circuit 112 provides the DC output voltage signal $V_{OUT}$ to a power line voltage DC PWR+ of a PV system associated with the PV sub-module 2300.

In another example, the gate control signal GC includes one gate control signal (e.g., GC1) and another gate control signal (e.g., GCL1). The voltage limit controller circuit 106 generates the gate control signals GC1 and GCL1. The switching converter circuit 112 receives the gate control signals GC1 and GCL1 from the voltage limit controller circuit 106. The switching converter circuit 112 converts the first DC string voltage signal DC PV+ to the DC output voltage signal $V_{OUT}$ in response to the gate control signals GC1 and GCL1.

In another example, the controller circuit 2302 also includes the voltage divider circuit 152. The voltage divider circuit 152 includes the DC voltage input 153 coupled to the DC voltage output 146, the compensation input 154 coupled to the compensation output 156, and an output voltage feedback output 158 coupled to the output voltage feedback input 122. In this example, the voltage divider circuit 152 receives the DC output voltage signal $V_{OUT}$ from the switching converter circuit 112. The voltage divider circuit 152 generates the $V_{OUT}$ feedback signal based on the DC output voltage signal $V_{OUT}$. The voltage divider circuit 152 provides the $V_{OUT}$ feedback signal to the voltage limit controller circuit 106. In a further example, the voltage limit controller circuit 106 generates the compensation signal COMP based on the difference between the PWM reference signal VPR and the $V_{OUT}$ feedback signal. The voltage divider circuit 152 receives the compensation signal COMP from the voltage limit controller circuit 106. The voltage divider circuit 152 generates the $V_{OUT}$ feedback signal based on the compensation signal COMP.

Modifications are possible in the described examples, and other examples are possible, within the scope of the claims. The various circuits described above can be implemented using any suitable combination of discrete components, ICs, processors, memory, storage devices, and firmware.

The following is claimed:

1. A controller circuit for a photovoltaic (PV) sub-module, the controller circuit comprising:
    a power harvest controller circuit including a first PV voltage input, a ceiling reference input, a floor reference input, and a gate control output;
    a switching converter circuit including a first gate control input, a second PV voltage input, and DC voltage output, the first gate control input coupled to the gate control output; and
    a maximum power point tracking (MPPT) reference and window generator circuit, including a DC voltage input coupled to the DC voltage output, a second gate control input coupled to the gate control output, a ceiling reference output coupled to the ceiling reference input, and a floor reference output coupled to the floor reference input.

2. The controller circuit of claim 1, wherein the PV sub-module includes the controller circuit.

3. The controller circuit of claim 1, wherein at least one the power harvest controller circuit, the switching converter circuit, and the MPPT reference and window generator circuit are included in an integrated circuit.

4. The controller circuit of claim 1, wherein the switching converter circuit is configured to convert a DC string voltage signal received at the second PV voltage input to a DC output voltage signal that is output at the DC voltage output in response to a gate control signal that is received at the first gate control input.

5. The controller circuit of claim 4, wherein the power harvest controller circuit is configured to adjust the gate control signal that is output at the gate control output in response to change in the DC string voltage signal that is received at the second PV voltage input to harvest power from the PV sub-module.

6. The controller circuit of claim 4, wherein the switching converter circuit provides the DC output voltage signal to a power line voltage associated with the PV sub-module.

7. The controller circuit of claim 4, wherein the gate control signal includes first and second gate control signals, and the switching converter circuit is configured to convert the DC string voltage signal to the DC output voltage signal in response to the first and second gate control signals.

8. The controller circuit of claim 1, wherein the MPPT reference and window generator circuit is configured to:
generate a ceiling reference signal representing a ceiling threshold for a DC string voltage signal from a string of PV cells associated with the PV sub-module based on a DC output signal received from the switching converter circuit and a gate control signal received from the power harvest controller circuit; and
generate a floor reference signal representing a floor threshold for the DC string voltage signal based on the DC output signal.

9. The controller circuit of claim 8, wherein the power harvest controller circuit is configured to generate the gate control signal based on the DC string voltage signal, the ceiling reference signal, and the floor reference signal that are received by the power harvest controller circuit.

10. A controller circuit for a photovoltaic (PV) sub-module, the controller circuit comprising:
a voltage limit controller circuit including a pulse width reference input, a feedback input, a gate control output, and a compensation output;
a switching converter circuit including a PV voltage input, a gate control input coupled to the gate control output, and a DC voltage output; and
a voltage divider circuit including a DC voltage input coupled to the DC voltage output, a compensation input, and a feedback output coupled to the feedback input.

11. The controller circuit of claim 10, wherein the voltage limit controller circuit is configured to generate a gate control signal that is output at the gate control output based on a feedback signal that is received at the feedback input.

12. The controller circuit of claim 11, wherein the feedback signal is indicative of a DC output voltage signal output at the DC voltage output.

13. The controller circuit of claim 10, wherein the switching converter circuit is configured to receive a string voltage signal at the PV voltage input and receive the gate control signal at the gate control input, and, in response to the gate control signal, convert the string voltage signal to a DC output voltage signal that is output at the DC voltage output.

14. The controller circuit of claim 11, wherein the voltage limit controller circuit is configured to receive a pulse width reference signal at the pulse width reference input and generate a compensation signal that indicative of a difference between the pulse width reference signal and the feedback signal and output the compensation signal at the compensation output.

15. The controller circuit of claim 14, wherein the pulse width reference signal represents a threshold for a DC output voltage signal that is output at the DC voltage output, the threshold indicative of a condition in which the DC output voltage signal is less than an open circuit voltage for the PV sub-module.

16. The controller circuit of claim 14, wherein the voltage divider is configured to generate the feedback signal based on the compensation signal.

17. The controller circuit of claim 10, wherein the voltage limit controller circuit is including in an integrated circuit.

18. The controller circuit of claim 17, wherein at least a portion of the switching converter circuit is included in the integrated circuit.

* * * * *